(12) United States Patent
Mitani

(10) Patent No.: US 7,009,234 B2
(45) Date of Patent: Mar. 7, 2006

(54) SEMICONDUCTOR DEVICE AND METHOD OF MANUFACTURING THE SAME

(75) Inventor: Junichi Mitani, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 7 days.

(21) Appl. No.: 10/268,677

(22) Filed: Oct. 11, 2002

(65) Prior Publication Data

US 2003/0049903 A1 Mar. 13, 2003

Related U.S. Application Data

(63) Continuation of application No. PCT/JP00/02445, filed on Apr. 14, 2000.

(51) Int. Cl.
*H01L 29/76* (2006.01)
*H01L 31/062* (2006.01)

(52) U.S. Cl. ...................... 257/300; 257/298
(58) Field of Classification Search ............. 257/298, 257/300, 303; 438/257
See application file for complete search history.

(56) References Cited

FOREIGN PATENT DOCUMENTS

| JP | 8-321591 | 12/1996 |
|---|---|---|
| JP | 9-260605 | 10/1997 |
| JP | 10-200067 | 7/1998 |
| JP | 11-87650 | 3/1999 |
| JP | 11-186522 | 7/1999 |
| JP | 11-204753 | 7/1999 |
| JP | 11-251559 | 9/1999 |
| JP | 2000-58797 | 2/2000 |

*Primary Examiner*—Amir Zarabian
*Assistant Examiner*—Kiesha Rose
(74) *Attorney, Agent, or Firm*—Westerman, Hattori, Daniels & Adrian, LLP

(57) ABSTRACT

A manufacturing method of a semiconductor device comprises the steps of forming an etching stop insulating film (18) that covers at least side surfaces of a wiring (16) in a first region (2) and a first-stage conductive plug (15b) in a second region (3), then forming insulating films (20, 28) on the etching stop insulating film (18) and the wiring (16), then forming a hole (28) on a first-stage conductive plug (15b) by etching a part of the insulating films (20, 28) until the etching stop insulating film (18) is exposed, then exposing an upper surface of the first-stage conductive plug (15b) by etching selectively the etching stop insulating film (18) through the hole (28), and then forming a second-stage conductive plug (31a) in the hole (28).

10 Claims, 20 Drawing Sheets

102: MEMORY CELL PORTION   103: PERIPHERAL CIRCUIT PORTION (b)

THE FIRST EMBODIMENT (#8) OF THE PRESENT INVENTION

THE FIRST EMBODIMENT (#9) OF THE PRESENT INVENTION

MEMORY CELL PORTION

THE FOURTH EMBODIMENT OF
THE PRESENT INVENTION

THE SIXTH EMBODIMENT OF
THE PRESENT INVENTION

SEMICONDUCTOR DEVICE AND METHOD OF MANUFACTURING THE SAME

This application is a continuation of international application PCT/JP00/02445, filed on Apr. 14, 2000.

TECHNICAL FIELD

The present invention relates to a semiconductor device and a method of manufacturing the same and, more particularly, a semiconductor device having a structure for connecting an upper conductive layer and a lower conductive layer via contact plugs at plural stages and a method of manufacturing the same.

BACKGROUND ART

In recent years, in the trend to the progress of the miniaturization of DRAM, there is such a tendency that the capacitor area is narrowed and the capacitor capacitance is reduced. Therefore, in order to increase the capacitor capacitance, the approach to increase the height of the capacitor is employed.

In this case, in the case that the capacitor is formed three-dimensionally on the silicon substrate like the stacked cell, the height of the contact hole formed in the interlayer insulating film is extremely raised if it is tried to connect the upper wiring to the gate electrode and the source/drain regions that are formed in the peripheral circuit portion.

Then, as the height of the contact hole is increased, there is the possibility that the fine patterning by the dry etching becomes difficult or the contact resistance is increased because the coverage of the conductive film that is formed in the contact hole becomes bad.

Therefore, recently such problem is settled not by forming the contacts between the upper and lower conductive patterns at a time but by employing the two-stage contact stacked structure consisting of the upper contact and the lower contact.

Next, the contact structure in the DRAM in the prior art will be explained with reference to FIGS. 1(a),(b) and FIG. 2 hereunder.

FIG. 1(a) shows the state after the bit line is formed on the interlayer insulating film that covers the MOS transistors in the memory cell portion.

In FIG. 1(a), in the active regions, which are surrounded by the element isolation insulating film 104, of the memory cell portion 102 and the peripheral circuit portion 103 on the silicon substrate 101, a plurality of gate electrodes 106, 107 are formed on the silicon substrate 101 via the gate oxide films 105a, 105b respectively. Also, the protection insulating film 108 made of the silicon nitride film is formed on the gate electrodes 106, 107.

The impurity diffusion layers 106a, 106b are formed in the silicon substrate 101 on both sides of the gate electrodes 106 in the memory cell portion 102. Then, the MOSFETs are constructed by the impurity diffusion layers 106a, 106b, the gate electrodes 106, etc.

Also, as shown in a plan view of FIG. 3, in the memory cell portion 102, a plurality of gate electrodes 106 are formed on one active region 110 surrounded by the element isolation insulating film 104, and the impurity diffusion layers 106a, 106b are formed between a plurality of gate electrodes 106 respectively. In this case, the gate electrodes 106 constitute a part of the word line.

FIG. 3 shows positions of the bit line contact and the storage contacts in one memory cell portion 102. In this case, FIG. 1(a) shows a sectional shape viewed from a I—I line in FIG. 3.

In contrast, in the peripheral circuit portion 103, the sidewalls 107s made of the silicon nitride, for example, are formed on the side surfaces of the gate electrode 107 and the impurity diffusion layers 107a, 107b having the LDD structure are formed in the silicon substrate 101 on both sides of the gate electrode 107. The MOSFET is constructed by the gate electrode 107, the impurity diffusion layers 107a, 107b, etc.

In this case, the sidewalls 106s made of the silicon nitride, for example, are also formed on the side surfaces of the gate electrodes 106 in the memory cell portion 102.

The MOSFETs having the above structure and the silicon substrate 101 are covered with the first interlayer insulating film 109 made of BPSG. Also, in the memory cell portion 102, the lower contact holes 109a, 109b are formed in the first interlayer insulating film 109 at the positions that are sandwiched between the gate electrodes 106.

These lower contact holes 109a, 109b are the self-align contacts that are positioned between the gate electrodes 106 in a self-alignment manner.

The lower plugs 110a, 110b made of the doped silicon are formed in the lower contact holes 109a, 109b.

In addition, the second interlayer insulating film 111 made of BPSG is formed on the lower plugs 110a, 110b and the first interlayer insulating film 109.

The upper contact hole 111a is formed in the second interlayer insulating film 111 on the lower plug 110a for the bit line contact in the memory cell portion 102. Also, the lower contact holes 111b, 111c having a depth to reach the impurity diffusion layers 107a, 107b respectively are formed in the first and second interlayer insulating film 109, 111 in the peripheral circuit portion 103.

The upper plug 112a made of the metal film having the multi-layered structure is formed in the upper contact hole 111a for the bit line in the memory cell portion 102. Also, the lower plugs 112b, 112c made of the metal film having the multi-layered structure are formed in the lower contact holes 111b, 111c in the peripheral circuit portion 103.

In addition, in the memory cell portion 102, the bit line 113 connected to the upper plug 112a is formed on the second interlayer insulating film 111. The upper surface of the bit line 113 is covered with the silicon nitride film 115, and the sidewalls 116 made of the silicon nitride are formed on the side surfaces of the bit line 113.

Then, as shown in FIG. 1(b), the steps of forming the upper plugs for the storage contact in the memory cell portion 102 is carried out.

In FIG. 1(b), the third interlayer insulating film 117 made of BPSG, or the like is formed on the bit line 113 and the second interlayer insulating film 111. Then, the upper contact holes 117b connected to the lower plugs 110b for the storage contact are formed on the third interlayer insulating film 117 in the memory cell portion 102. The upper plugs 118 made of the doped silicon are formed in the upper contact holes 117b.

In this case, a sectional shape that is viewed from a III—III line in FIG. 1(b) and a II—II line in FIG. 3 is shown in FIG. 4.

Then, as shown in FIG. 2, the capacitors 120 are formed on the third interlayer insulating film 117 in the memory cell portion 102. Then, the fourth interlayer insulating film 121 for covering the capacitors 120 is formed on the third interlayer insulating film 117. Also, the upper plugs 122b, 122c connected to the lower plugs 112b, 112c are formed in the third and fourth interlayer insulating films 117, 121 in the peripheral circuit portion 103.

In the peripheral circuit portion 103, the lower plugs 112b, 112c and the upper plugs 122b, 122c are formed by the metal film having the triple-layered structure consisting of titanium (T), titanium nitride (TiN), and tungsten (W) respectively. The titanium is formed to lower the contact resistance of the metal film. Also, the titanium nitride is formed as the barrier metal to prevent the increase of the resistance caused by the reaction between the tungsten and the titanium.

Next, the capacitors are formed by following steps.

First, the silicon nitride film 119 is formed on the third interlayer insulating films 117, then the BPSG film (not shown) is formed thick on the silicon nitride film 119, and then the openings each having the capacitor shape are formed on the upper plugs 118 and their peripheral areas in the memory cell portion 102 by patterning the BPSG film and the silicon nitride film 119 in the memory cell portion 102. Then, the silicon film is formed along the upper surface of the BPSG film and the inner surfaces of the openings, and then the silicon film on the BPSG film is removed by the chemical mechanical polishing (CMP) method. Then, if the BPSG film is removed by the hydrofluoric acid, the cylindrical silicon films are left on the third interlayer insulating films 117. These silicon films are used as the storage electrode 120a of the capacitor 120 respectively. In this case, the silicon nitride film 119 acts as the etching stopper in removing the BPSG film.

The dielectric film 120b is formed on the surface of the storage electrode 120a. Then, the cell plate electrode 120c is formed on the dielectric film 120b.

The cell plate electrode 120c, the dielectric film 120b, and the silicon nitride film 119 are removed from the peripheral circuit portion 103 by the patterning.

Then, after the capacitors 120 are formed, the fourth interlayer insulating film 121 is formed.

In the peripheral circuit portion 103, the third and fourth interlayer insulating films 117, 121 are patterned and thus the upper contact holes 121b, 121c are formed on the lower plugs 112b, 112c. Subsequently, the upper plugs 122b, 122c made of the same multi-layered structure as the lower plugs 112b, 112c are formed in the upper contact holes 121b, 121c.

The upper wirings 123b, 123c formed on the fourth interlayer insulating film 121 in the peripheral circuit portion 103 are connected to the impurity diffusion layers 107a, 107b via the upper plugs 122b, 122c and the lower plugs 112b, 112c.

Meanwhile, in the peripheral circuit portion 103 of the semiconductor device as described above, the upper wirings 123b, 123c are connected electrically to the impurity diffusion layers 107a, 107b via the upper plugs 122b, 122c and the lower plugs 112b, 112c, which are stacked in two stages. In this case, if the upper contact holes 121b, 121c are displaced, there is such a possibility that, as shown in FIG. 5, the upper plugs 122b, 122c are dropped lower than the upper surfaces of the lower plugs 112b, 112c.

The reason for that the upper plugs 122b, 122c are dropped deeper than the upper surfaces of the lower plugs 112b, 112c in this manner is that, when the upper contact holes 121b, 121c are formed, the over-etching is applied to assure the openings without the problem irrespective of the variation in the film thickness of the third and fourth interlayer insulating film 117, 121.

A portion A in FIG. 5 shows the state that a part of the upper contact hole 121c protrudes from the lower plug 112c to reach the neighborhood of the gate electrode 107. In this state, it is possible that the breakdown voltage between the lower plug 112c and the gate electrode 107 is lowered. Also, if the gate electrode 107 has the salicide structure and the protection insulating film 108 is not present thereon, there is a possibility that the lower plug 112c and the gate electrode 107 are short-circuited.

A portion B in FIG. 5 shows the case that a part of the upper contact hole 121b is deviated from the lower plug 112b to reach the element isolation insulating film 104. There is such a possibility that, when the upper contact hole 121b is formed, the edge of the element isolation insulating film 104 is etched to expose the silicon substrate 101 around the impurity diffusion layer 107a. Then, when the upper plug 122b is connected on the impurity diffusion layer 107a and its periphery on the silicon substrate 101, the junction leakage is increased.

Also, a portion C in FIG. 5 shows the upper surface of the lower plug 112b and its peripheral portion when a part of the upper contact hole 121b protrudes from the lower plug 112b. Since the upper contact hole 121b formed on the side of the lower plug 112b has the high aspect ratio, the coverage of the metal film formed in the hole 121b becomes worse. As a result, the titanium nitride that must be formed thin essentially becomes further thin locally. Thus, it is possible that the tungsten and the titanium react with each other at the location and thus the contact resistance is increased.

In contrast, as shown in FIG. 2, the upper contact holes 117b under the capacitors 120 are shallower than the contact holes 121b, 121c in the peripheral circuit portion 103 by the difference in the film thickness between the fourth interlayer insulating film 121 and the second interlayer insulating film 111. Normally, the fourth interlayer insulating film 121 is formed considerably thicker than the second interlayer insulating film 111. Therefore, an amount of the over-etching, which is applied to compensate the variation in the film thickness when the upper contact holes 117b under the capacitors 120 are formed, becomes smaller than that of the over-etching applied when the upper contact holes 121b, 121c in the peripheral circuit portion 103 are formed. As a result, even if the upper contact holes 117b are deviated from the upper surfaces of the lower plugs 110b because of their displacement, such deviation is hard to become the fatal problem.

DISCLOSURE OF INVENTION

It is an object of the present invention to provide a semiconductor device having a structure that is capable of forming upper holes, into which plugs are buried, up to a predetermined depth not to increase the number of steps, and a method of manufacturing the same.

According to the present invention, at least side surfaces of a wiring on a first insulating film are covered with a second insulating film in a first region and an upper surface of a first-stage conductive plug and its periphery are covered with the second insulating film in a second region, then third insulating films made of material different from the second insulating film are formed on the second insulating film, then a hole is formed on a first-stage conductive plug in the second region by etching selectively a part of the third insulating films while using the second insulating film as the etching stopper, then an upper surface of the first-stage conductive plug is exposed by etching selectively the second insulating film via the hole, and then a second-stage conductive plug is formed in the hole.

Therefore, even if the over-etching is applied when the hole is formed in the third insulating films, the underlying first insulating film is not etched. Thus, the second-stage conductive plug is never dropped down largely rather than the first-stage conductive plug. In addition, since the insulating film formed on side surfaces of the wiring in the first region is utilized as the etching stop film in the second region, the characteristics of the transistors formed on the semiconductor substrate are not badly affected and also the increase in the number of steps can be suppressed to the lowest minimum.

In this case, the first region is a region in which the memory cells are formed, for example, and the second region is a region in which the peripheral circuits are formed, for example.

BEST MODE FOR CARRYING OUT THE INVENTION

Figure 1:
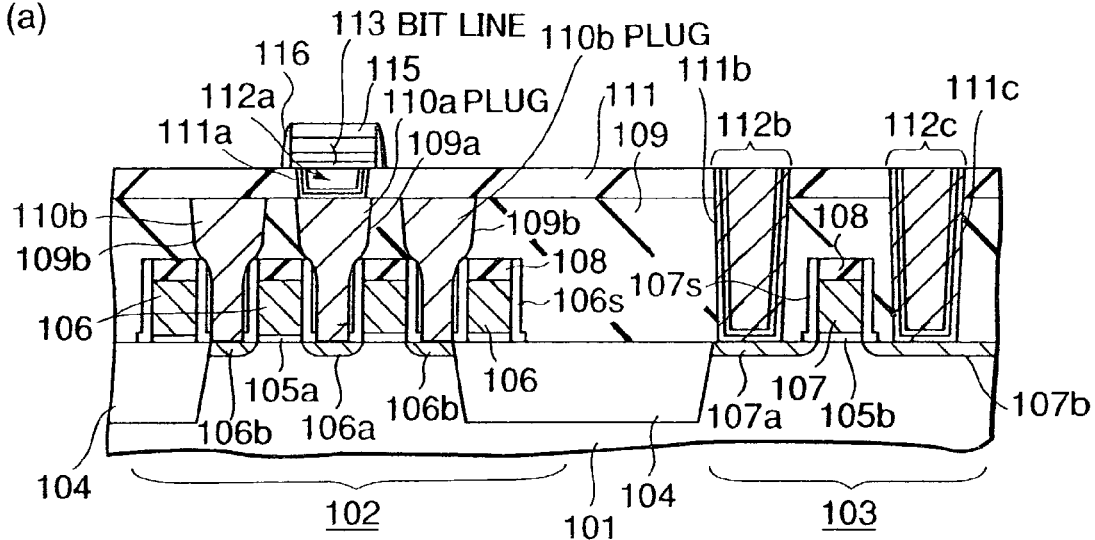
FIGS. 1(a),(b) are sectional views (#1) showing an example of semiconductor device manufacturing steps in the prior art.
Figure 1:
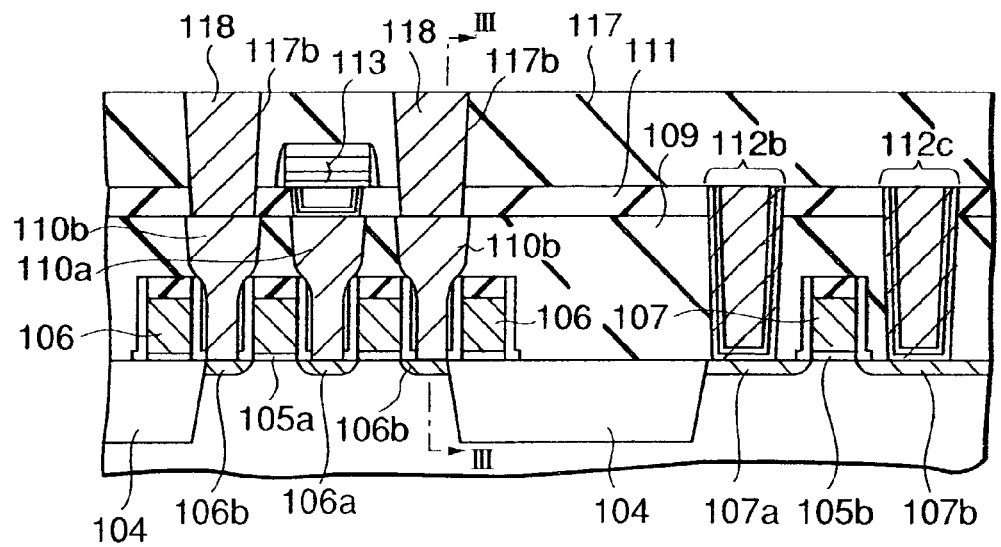
Figure 2:
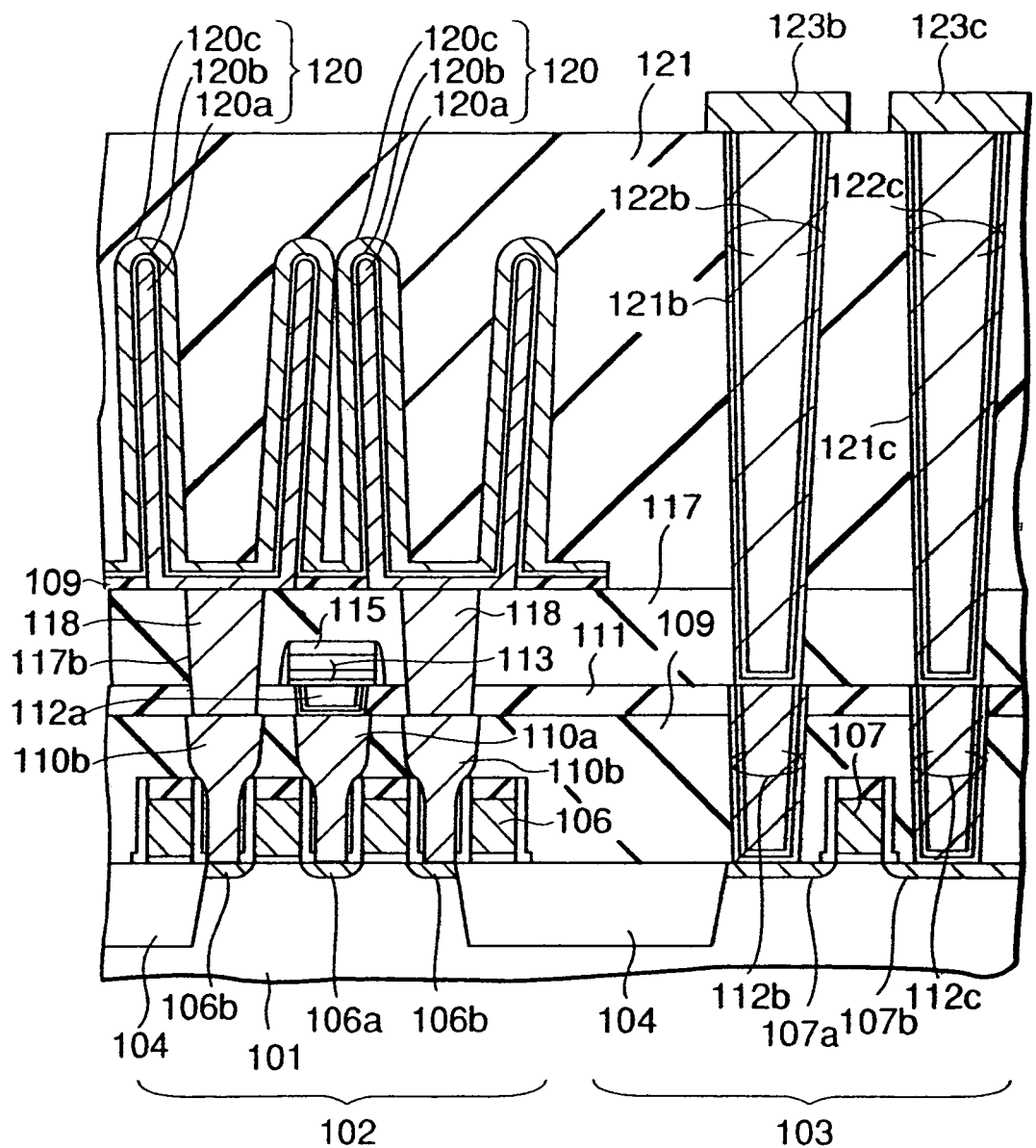
FIG. 2 is a sectional view (#2) showing an example of semiconductor device manufacturing steps in the prior art.
Figure 3:
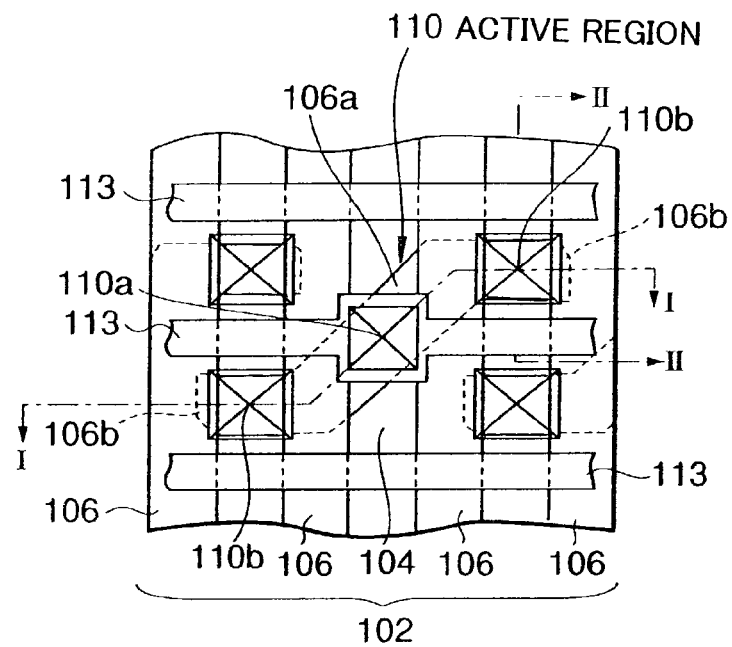
FIG. 3 is a plan view showing an arrangement of contact holes in a memory cell portion of the semiconductor device.
Figure 4:
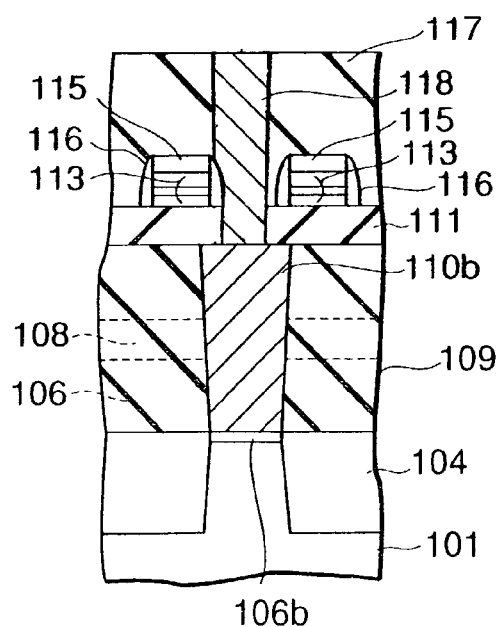
FIG. 4 is a sectional view viewed from a III—III line in FIG. 1(b) and a II—II line in FIG. 3.

Embodiments of the present invention will be explained with reference to the drawings hereinafter.

(First Embodiment)

FIG. 6 to FIG. 12 are sectional views showing manufacturing steps of a semiconductor device according to a first embodiment of the present invention.

First, steps required until a structure shown in FIG. 6(a) is formed will be explained hereunder.

At least a memory cell portion 2 and a peripheral circuit portion 3 are present on an n-type silicon (semiconductor) substrate 1, and an element isolation insulating film 4 having a shallow trench isolation (STI) structure is formed on the silicon substrate 1. In this case, the element isolation structure such as LOCOS, or the like may be employed instead of STI.

After such element isolation insulating film 4 is formed, p-type wells 1a, 1b are formed by implanting the p-type impurity ion into predetermined active regions in the memory cell portion 2 and the peripheral circuit portion 3. The structure in which the p-type well 1b is formed in the peripheral circuit portion 3 in FIG. 6(a) is shown, but an n-type active region (not shown) into which the p-type impurity is not implanted is also present.

A CMOS is formed in the peripheral circuit portion 3. In other words, an n-channel MOSFET is formed in the p-type well 1b in the peripheral circuit portion 3 by the steps described later, and a p-channel MOSFET (not shown) is formed in the n-type active region (not shown).

Then, gate oxide films 5a, 5b are formed by thermally oxidizing a surface of the silicon substrate 1 in the memory cell portion 2 and the peripheral circuit portion 3 respectively.

In addition, a conductive film, e.g., a conductive film having a double-layered structure consisting of doped silicon and silicide is formed on the gate oxide films 5a, 5b, and then a first protection insulating film 8 made of silicon nitride is formed on the conductive film to have a thickness of 150 nm, for example.

After this, the first protection insulating film 8 and the conductive film are patterned into a gate electrode shape by the photolithography method using the resist. Accordingly, a plurality of gate electrodes 6 made of the conductive film and also used as word lines are formed in the memory cell portion 2 and a plurality of gate electrodes 7 made of the conductive film are formed in the peripheral circuit portion 3. In the memory cell portion 2, a plurality of gate electrodes 6 are arranged in parallel on one p-type well 1a, which is surrounded by the element isolation insulating film 4, via the gate insulating film 5a.

Then, n-type impurity diffusion layers 6a, 6b are formed on both sides of the gate electrodes 6 by ion-implanting selectively the n-type impurity into the memory cell portion 2 on the silicon substrate 1 while using a resist mask (not shown) in which the memory cell portion 2 is opened. In the memory cell portion 2, MOSFETs are constructed by the gate electrodes 6, the n-type impurity diffusion layers 6a, 6b, etc. Then, low concentration portions of impurity diffusion layers 7a, 7b are on both sides of the gate electrodes 7 by ion-implanting selectively the impurity ion into the peripheral circuit portion 3 on the silicon substrate 1 while using a resist mask (not shown) in which the peripheral circuit portion 3 is opened.

After the resist mask is removed, an oxide film (not shown) of several nm thickness is formed by oxidizing surfaces of the impurity diffusion layers 6a, 6b, 7a, 7b in the dry oxidation atmosphere at 800° C. by virtue of the thermal oxidation, for example.

Then, a silicon nitride film of 20 to 100 thickness is formed on upper and side surfaces of the gate electrodes 6, 7 and on the silicon substrate 1 by the chemical vapor deposition (CVD) method using silane and ammonia. Then, the anisotropic etching is applied to the silicon nitride film to leave the film on side surfaces of the gate electrodes 6, 7 as sidewalls 6s, 7s.

Then, the impurity is ion-implanted into the silicon substrate 1 in the peripheral circuit portion 3 by using the gate electrodes 7 and the sidewalls 7s in the peripheral circuit portion 3 as a mask while covering the memory cell portion 2 with a photoresist (not shown). Accordingly, in the peripheral circuit portion 3, high concentration portions of the impurity diffusion layers 7a, 7b are formed on both sides of the gate electrodes 7, and these impurity diffusion layers 7a, 7b have the LDD structure. In the peripheral circuit portion 3, the MOSFET is constructed by the impurity diffusion layers 7a, 7b, the gate electrodes 7, etc.

Then, a BPSG (Boro-Phospho Silicate Glass) film of 1000 nm thickness, for example, is formed on the gate electrodes 6, 7, the sidewalls 6s, 7s, the impurity diffusion layers 6a, 6b, 7a, 7b, and the element isolation insulating film 4 as a first interlayer insulating film 9 by the CVD method. The first interlayer insulating film 9 is subjected to the thermal reflow, and is planarized by polishing the upper surface by virtue of the chemical mechanical polishing (CMP) method. The polishing is executed until a thickness of the first interlayer insulating film 9 becomes about 500 nm from the surface of the silicon substrate 1.

Here, for the purpose of avoiding the degradation of the MOSFET characteristics by the thermal reflow, an oxide film (HDP, etc.) may be formed by the plasma CVD method as the first interlayer insulating film 9 and then an upper surface of the oxide film is polished by the CMP method to make flat.

Then, in the memory cell portion 2, lower contact holes 10a, 10b are formed in the first interlayer insulating film 9 at positions, which are sandwiched by the gate electrodes 6, by the photolithography method. These lower contact holes 10a, 10b are formed as the self-align contacts that are positioned by the sidewalls 6s between the gate electrodes 6 in a self-alignment manner.

Then, an amorphous silicon film into which the phosphorus is doped is formed in the lower contact holes 10a, 10b and on the first interlayer insulating film 9, and then the amorphous silicon film is removed from the upper surface of the first interlayer insulating film 9 by the CMP method. Accordingly, the amorphous silicon film being left in the lower contact holes 10a, 10b is used as lower contact plugs 11a, 11b.

In this case, out of three lower contact plugs 11a, 11b that are formed on one active region being surrounded by the element isolation insulating film 4, the middle lower contact plug 11a is used as the bit line contact and remaining lower contact plugs 11b are used as the storage contact.

Next, steps required to get the state shown in FIG. 1(b) will be explained hereunder.

First, a second interlayer insulating film 12 made of BPSG, a plasma oxide film, or the like is formed on the lower contact plugs 11a, 11b and the first interlayer insulating film 9 to have a thickness of 200 nm. Then, an upper contact hole 13a is formed on the lower contact plug 11a for the bit line contact by patterning the second interlayer insulating film 12 in the memory cell portion 2 by virtue of the photolithography method. Then, lower contact holes 13b, 13c are formed on the impurity diffusion layers 7a, 7b by patterning the first and second interlayer insulating films 9, 12 in the peripheral circuit portion 3 by virtue of the photolithography method.

Here, the upper contact hole 13a in the memory cell portion 2 and the lower contact holes 13b, 13c in the peripheral circuit portion 3 may be formed simultaneously. In this case, since the upper contact hole 13a for the bit line contact is relatively shallow, the careful attention must be paid to the displacement from the underlying lower contact plug 11a.

Next, steps required until a structure shown in FIG. 6(c) is formed will be explained hereunder.

First, a titanium (Ti) film 14a of 50 nm thickness, a titanium nitride (TiN) film 14b of 50 nm thickness, and a tungsten (W) film 14c of 300 nm thickness are formed sequentially in the upper contact hole 13a and the lower contact holes 13b, 13c and on the second interlayer insulating film 12 by the CVD method.

Then, the Ti film 14a, the TiN film 14b, and the W film 14c are polished by the CMP method to remove these films from an upper surface of the second interlayer insulating film 12. Accordingly, the metal films 14a to 14c being left in the upper contact hole 13a in the memory cell portion 2 are used as an upper contact plug 15a for the bit line contact, and the metal films 14a to 14c being left in the lower contact holes 13b, 13c in the peripheral circuit portion 3 are used as lower contact plugs 15b, 15c.

Here, the titanium film 14a is provided to get the good electrical contact to the lower contact plug 11a and the impurity diffusion layers 7a, 7b, which are formed under this titanium film. The titanium nitride film 14b is provided as a barrier layer for suppressing the reaction between the tungsten film 14c and the titanium film 14a.

Next, steps required until a structure shown in FIG. 7(a) is formed will be explained hereunder.

First, a titanium film 16a of 50 nm thickness, a titanium nitride film 16b of 50 nm thickness, and a tungsten film 16c of 100 nm thickness are formed sequentially on the contact plugs 15a to 15c and the second interlayer insulating film 12 by the CVD method. Then, a second protection insulating film 17 made of silicon nitride and having a thickness of 100 nm is formed on the tungsten film 16c by the CVD method. Here, the titanium film 16a, the titanium nitride film 16b, and the tungsten film 16c are formed by the CVD method, but these films can be formed by the sputter method since the underlying film is flat.

Then, the Ti film 16a, the TiN film 16b, and the W film 16c and the second protection insulating film 17 are shaped into the bit line in the memory cell portion 2 by patterning these films by virtue of the photolithography method. Accordingly, the bit line 16 consisting of the titanium film 16a, the titanium nitride film 16b, and the tungsten film 16c is connected electrically to the impurity diffusion layer 6a via the upper contact plug 15a and the lower contact plug 11a.

The second protection insulating film 17 is used to prevent the short-circuit between the contact plug for the storage contact, which is formed later, and the bit line 16.

In this case, in the peripheral circuit portion 3, the titanium film 16a, the titanium nitride film 16b, and the tungsten film 16c may be patterned and be left as the wiring.

Next, steps required to get the state shown in FIG. 7(b) will be explained hereunder.

First, a silicon nitride (etching stopper) film 18 of 20 to 100 nm thickness is formed on an overall surface by the low pressure (LP) CVD method. As the growth conditions of the silicon nitride film 18, the mixed gas consisting $SiH_2Cl_2$ or $SiH_4$ and $NH_3$ is used, the growth temperature is set to 600° C. to 800° C., preferably 750° C., and the pressure in the growth atmosphere is set to 0.1 to 1.0 Torr.

Then, a photoresist 19 is coated on the silicon nitride film 18, and this photoresist 19 is exposed/developed to be left only in the peripheral circuit portion 3.

Then, as shown in FIG. 8(a), the anisotropic etching is applied to the silicon nitride film 18, which exits in the memory cell portion 2, in the almost vertical direction to be left on the side surfaces of the bit line 16. Such silicon nitride film 18 is left as sidewalls 18s. Since the silicon nitride film 18 in the peripheral circuit portion 3 is covered with the photo resist 19 during the etching, the state that the lower contact plugs 15b, 15c and the second interlayer insulating film 12 are covered with the silicon nitride film 18 is still maintained.

The silicon nitride film 18 may be left on the overall peripheral circuit portion 3. Since normally the silicon nitride film causes the device characteristics of the MOSFET, etc. to degrade, such silicon nitride film of the size that contains the displacement margin may be left at the locations, onto which the upper contact holes to be formed by later steps are dropped down, within the minimum range. For example, the silicon nitride film 18 may be left on the lower contact plugs 15b, 15c and their peripheral area.

The photoresist 19 in the peripheral circuit portion 3 is removed after the patterning of the silicon nitride film 18 is completed.

Next, steps required to form a structure shown in FIG. 8(b) will be explained hereunder.

First, as a third interlayer insulating film 20, a silicon oxide film of 800 nm thickness, for example, is formed on the overall surface by the plasma CVD method. The third interlayer insulating film 20 is made of the material that can be etched selectively to the silicon nitride film 18.

Then, the third interlayer insulating film 20 is polished by the CMP method to planarize its surface. The polishing of the third interlayer insulating film 20 is continued until such third interlayer insulating film 20 remains have a thickness of about 150 nm from an upper surface of the second protection insulating film 17 that protects the bit line 16.

Then, in the memory cell portion 2, upper contact holes 20b are formed on the lower contact plugs 11b for the storage contact by patterning the second and third interlayer insulating films 12, 20 by virtue of the photolithography method.

Figure 13:
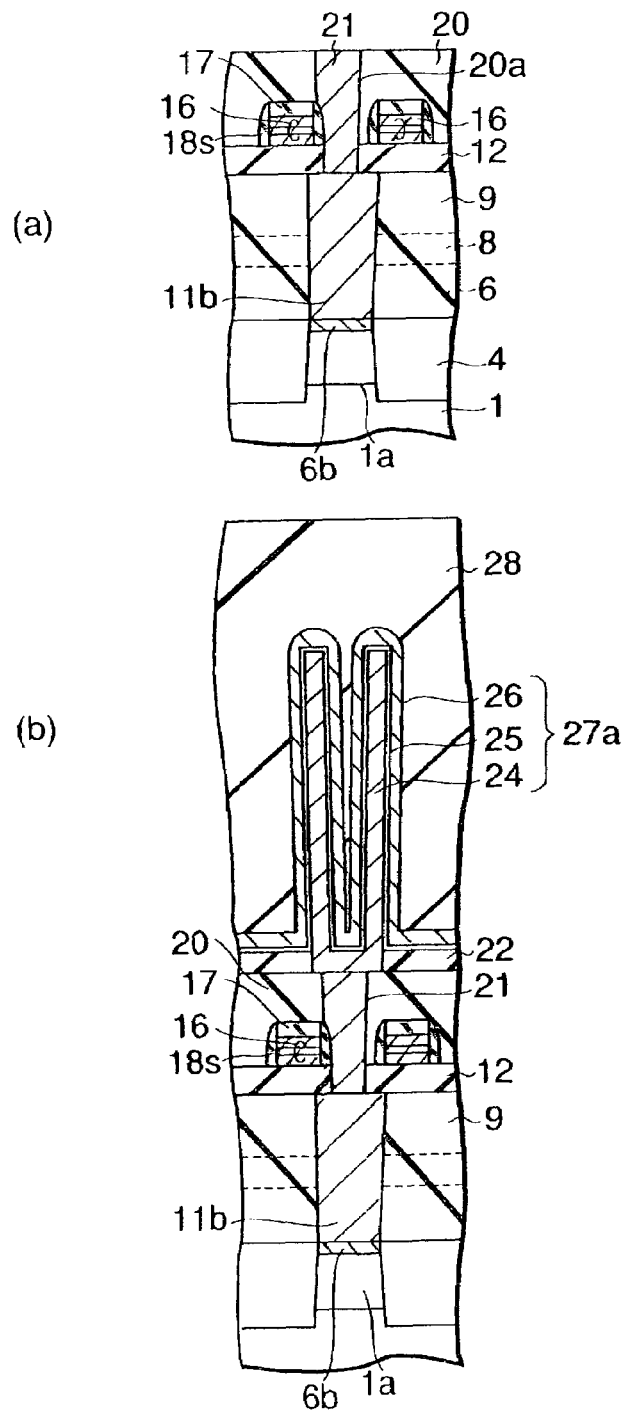
FIG. 13(a) is a V—V line sectional view shown in FIG. 8(b)
FIG. 13(b) is a VI—VI line sectional view shown in FIG. 12.

In this case, the conditions that an etching rate of the silicon nitride film becomes slower than the BPSG and the silicon oxide film constituting the second and third interlayer insulating films 12, 20 are selected. Thus, the upper contact holes 20b are not formed on the second protection insulating film 17 and the sidewalls 18s that cover the bit line 16, and thus are never connected to the bit line 16. As a result, as shown in FIG. 13(a), the upper contact holes 20b for the storage contact are formed in a self-alignment manner. In this case, FIG. 13(a) is a sectional view taken along a V—V line in FIG. 8(b).

Then, a phosphorus-doped amorphous silicon film is formed on the third interlayer insulating film 20 and in the upper contact holes 20b. This amorphous silicon film is grown on the third interlayer insulating film 20 by the CVD method to have a thickness of 300 nm. In turn, the amorphous silicon film on the third interlayer insulating film 20 is removed by the CMP method. Then, the amorphous silicon being left in the upper contact holes 20b for the storage contact is left as upper contact plugs 21 for the storage contact.

The upper contact plugs 21 are connected electrically to one impurity diffusion layers 6b of the MOSFETs via the lower contact plugs 11b.

Figure 9:
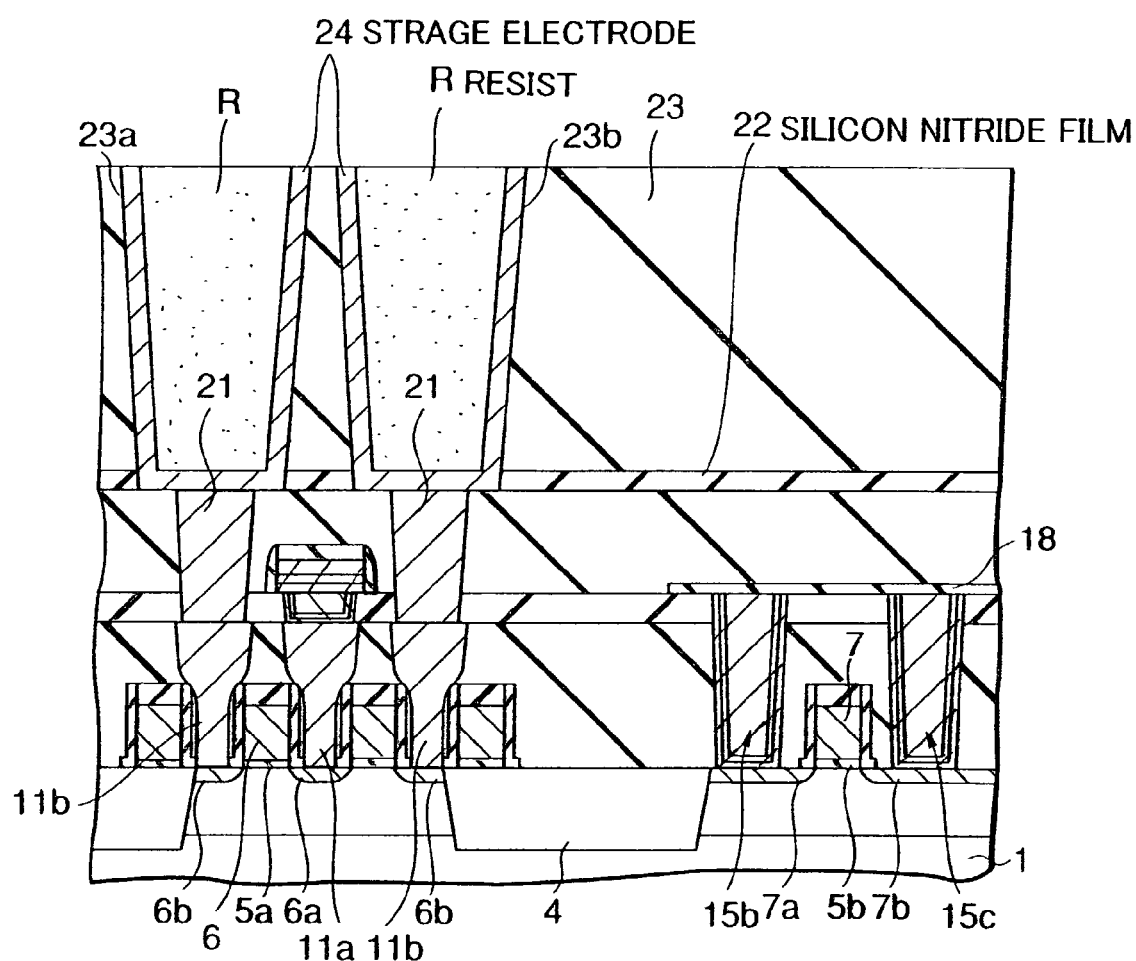
FIG. 9 is a sectional view (#4) showing the manufacturing steps of the semiconductor device according to the first embodiment of the present invention.

Next, steps required to form a structure shown in FIG. 9 will be explained hereunder.

First, a silicon nitride film 22 of 50 nm thickness is formed on the third interlayer insulating film 20 and the upper contact plugs 21 by the low pressure CVD method at the growth temperature of 750° C., for example. This silicon nitride film 22 of 50 nm thickness is formed as one of the film seeds and the film thicknesses, which do not transmit the hydrofluoric acid used in the later steps.

Then, a BPSG film 23 of 1000 nm thickness is formed on the silicon nitride film 22 by the CVD method.

Then, openings 23a, 23b having a storage electrode shape are formed in the BPSG film 23 and the silicon nitride film 22 by the patterning using the photolithography method.

Then, the phosphorus-doped amorphous silicon film is formed along an upper surface of the BPSG film 23 and inner peripheral surfaces of the openings 23a, 23b by the CVD method. In this case, a thickness of the amorphous silicon film on the BPSG film 23 is set to 50 nm.

Then, the amorphous silicon film on the BPSG film 23 is removed selectively by the CMP method, and thus the amorphous silicon film being left only in the openings 23a, 23b is used as storage electrodes 24. The storage electrodes 24 have a cylindrical shape and are connected to the underlying upper contact plugs 21.

Now, in order to prevent the situation that the slurry used to polish the amorphous silicon film enters into the openings 23a, 23b, after the amorphous silicon film is formed, the photoresist R may be filled in the openings 23a, 23b and then the polishing by the CMP method may be executed. In this case, after the amorphous silicon film is polished, the photoresist R is removed by the normal resist peeling process.

Figure 10:
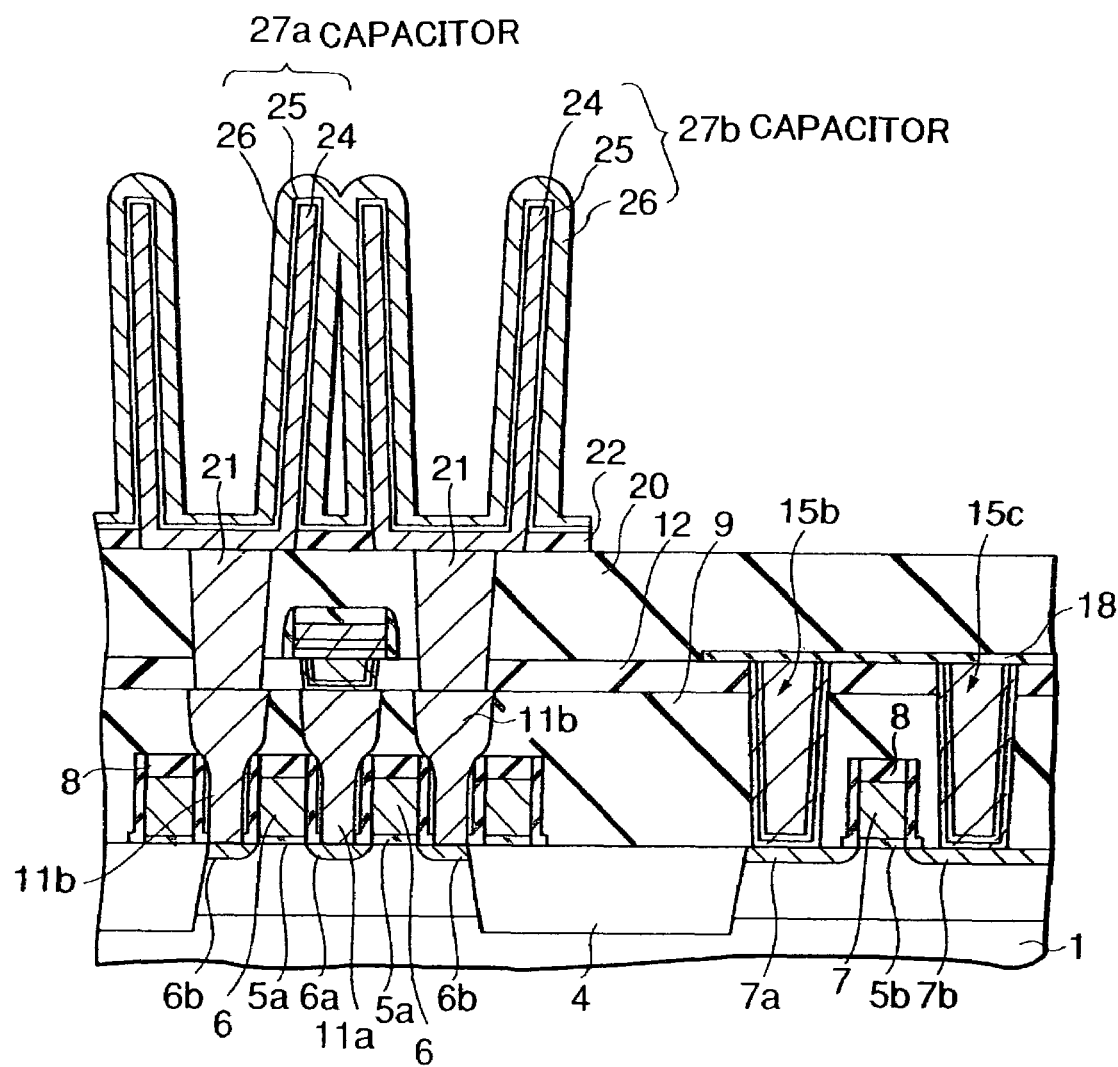
FIG. 10 is a sectional view (#5) showing the manufacturing steps of the semiconductor device according to the first embodiment of the present invention.

Next, steps required until a structure shown in FIG. 10 is formed will be explained hereunder.

First, the BPSG film 23 is removed selectively by the hydrofluoric acid. At this time, the silicon nitride film 22 under the BPSG film 23 has the quality and the thickness, which can perform the function to protect the third interlayer insulating film 20 from the hydrofluoric acid process applied for a long time. Outer peripheral surfaces of the storage electrodes 24 are exposed by removing the BPSG film 23.

Then, a silicon nitride film of 5 nm thickness is formed on surfaces of the storage electrodes 24 and an upper surface of the silicon nitride film 22 by the CVD method. Then, a surface of the silicon nitride film is oxidized and then such oxidized surface is used as a capacitor dielectric film 25.

Then, a phosphorus-doped amorphous silicon film of 50 nm thickness is formed on the capacitor dielectric film 25 by the CVD method. Then, the amorphous silicon film is patterned by the lithography steps and is left on the storage electrodes 24, and such film is used as cell plate electrodes 26. In this case, the silicon nitride film 22 is patterned into the same shape to remove the cell plate electrodes 26, the dielectric film 25, and the silicon nitride film 22 from the peripheral circuit portion 3.

Capacitors 27a, 27b of the DRAM cells are constructed by the storage electrodes 24, the capacitor dielectric film 25, and the cell plate electrodes 26.

Figure 11:
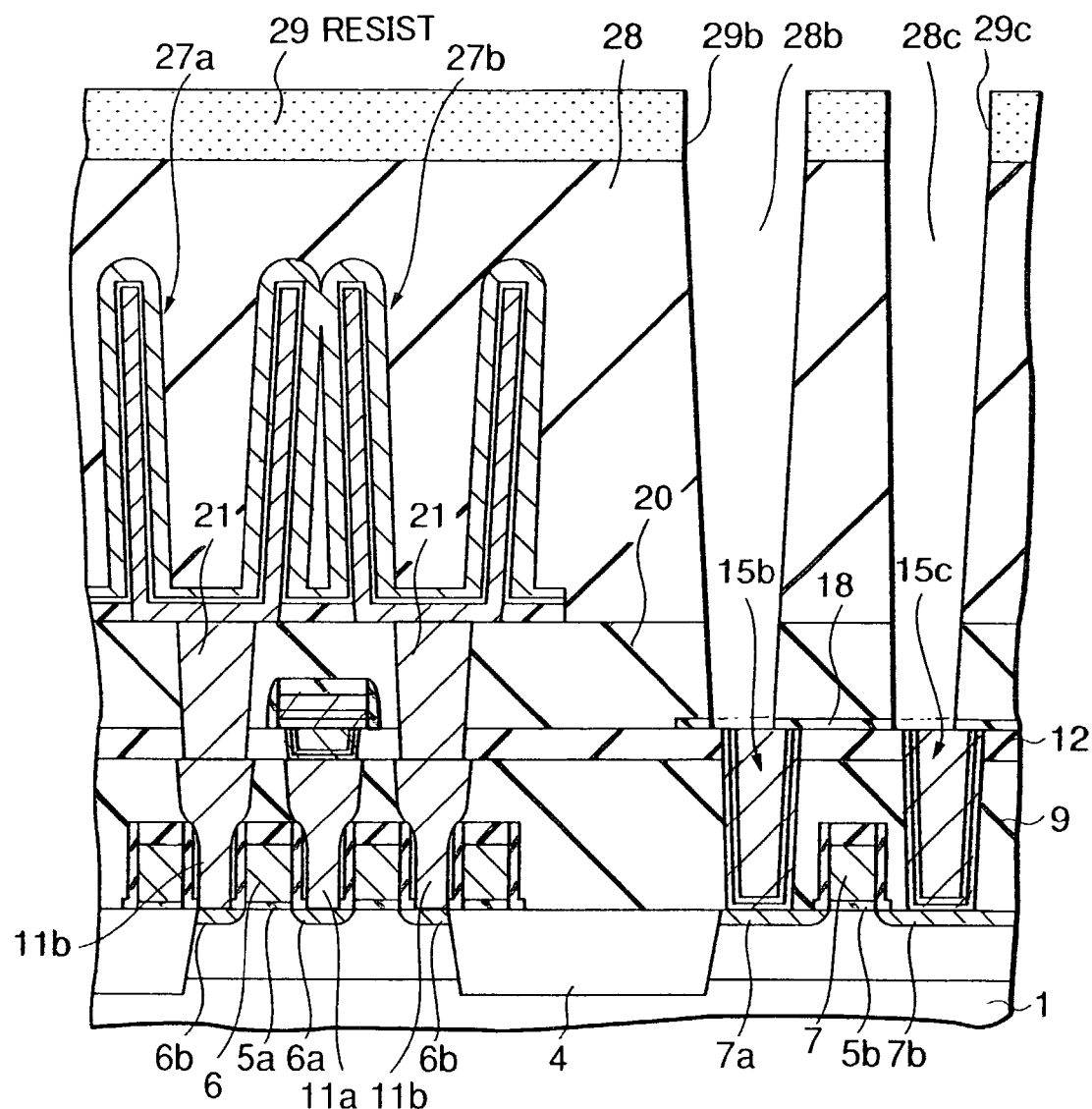
FIG. 11 is a sectional view (#6) showing the manufacturing steps of the semiconductor device according to the first embodiment of the present invention.

Next, steps required until a structure shown in FIG. 11 is obtained will be explained hereunder.

First, a fourth interlayer insulating film 28 for covering the capacitors 27a, 27b is formed on the third interlayer insulating film 20. As the fourth interlayer insulating film 28, a silicon oxide film that is formed by the plasma CVD method and having a thickness of 2000 nm is employed.

Then, a surface of the fourth interlayer insulating film 28 is polished flat by the CMP method. This polishing is continued until the fourth interlayer insulating film 28 has a thickness of about 2.0 to 2.5 μm from the silicon substrate.

In addition, a photoresist 29 is coated on the fourth interlayer insulating film 28, and then windows 29b, 29c are formed over the lower contact plugs 15b, 15c in the peripheral circuit portion 3 by exposing/developing the photoresist 29. Then, upper contact holes 28b, 28c are formed by anisotropic-etching the fourth interlayer insulating film 28 and the underlying third interlayer insulating film 20 via the windows 29b, 29c.

In this case, the $C_4F_8$ gas is used as the etching gas. Accordingly, the etching rate of the underlying silicon nitride film 18 becomes slow in etching the third and fourth interlayer insulating films 20, 28.

Therefore, since the silicon nitride film 18 functions as the etching stopper film, the upper contact holes 28b, 28c are not formed in the second interlayer insulating film 12.

Figure 5:
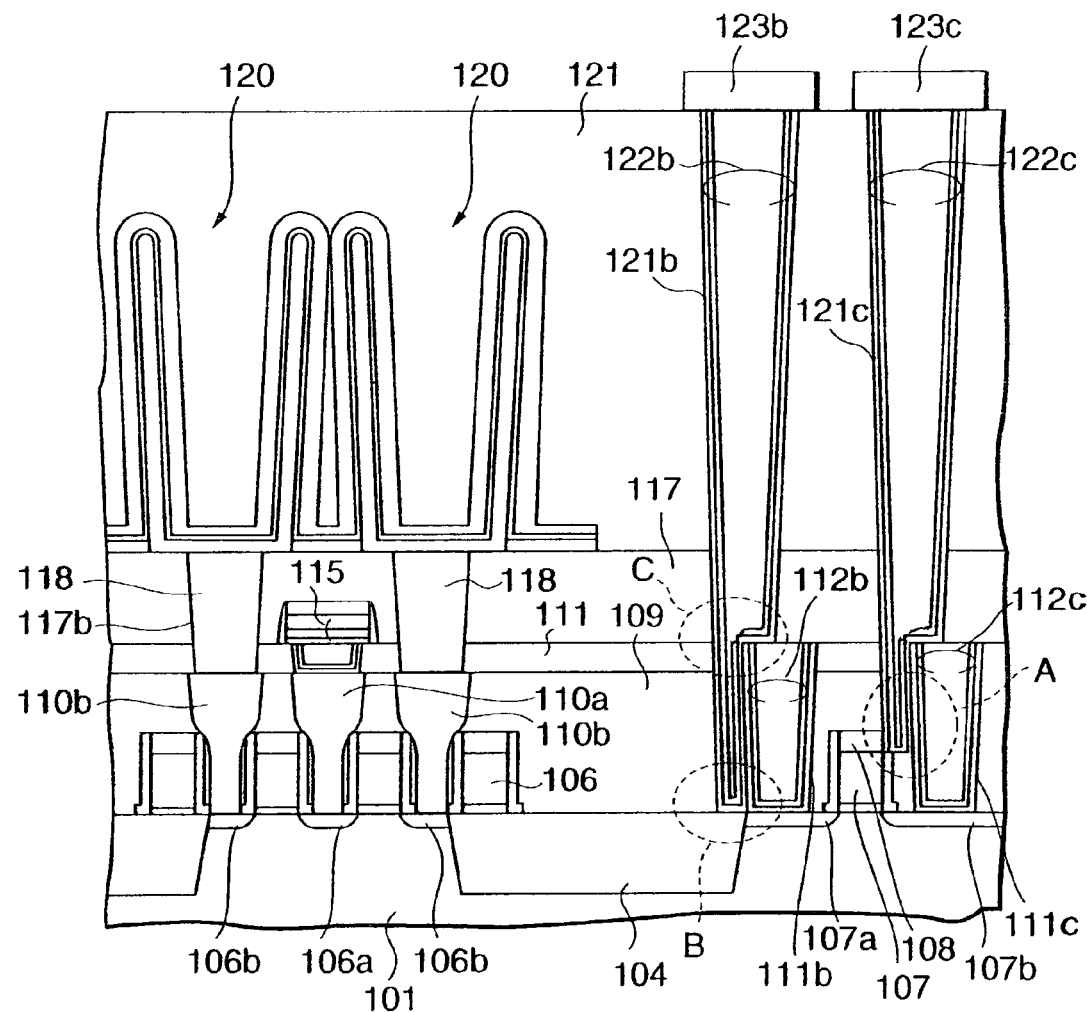
FIG. 5 is a sectional view showing the problem in the semiconductor device manufacturing steps in the prior art.
Figure 6:
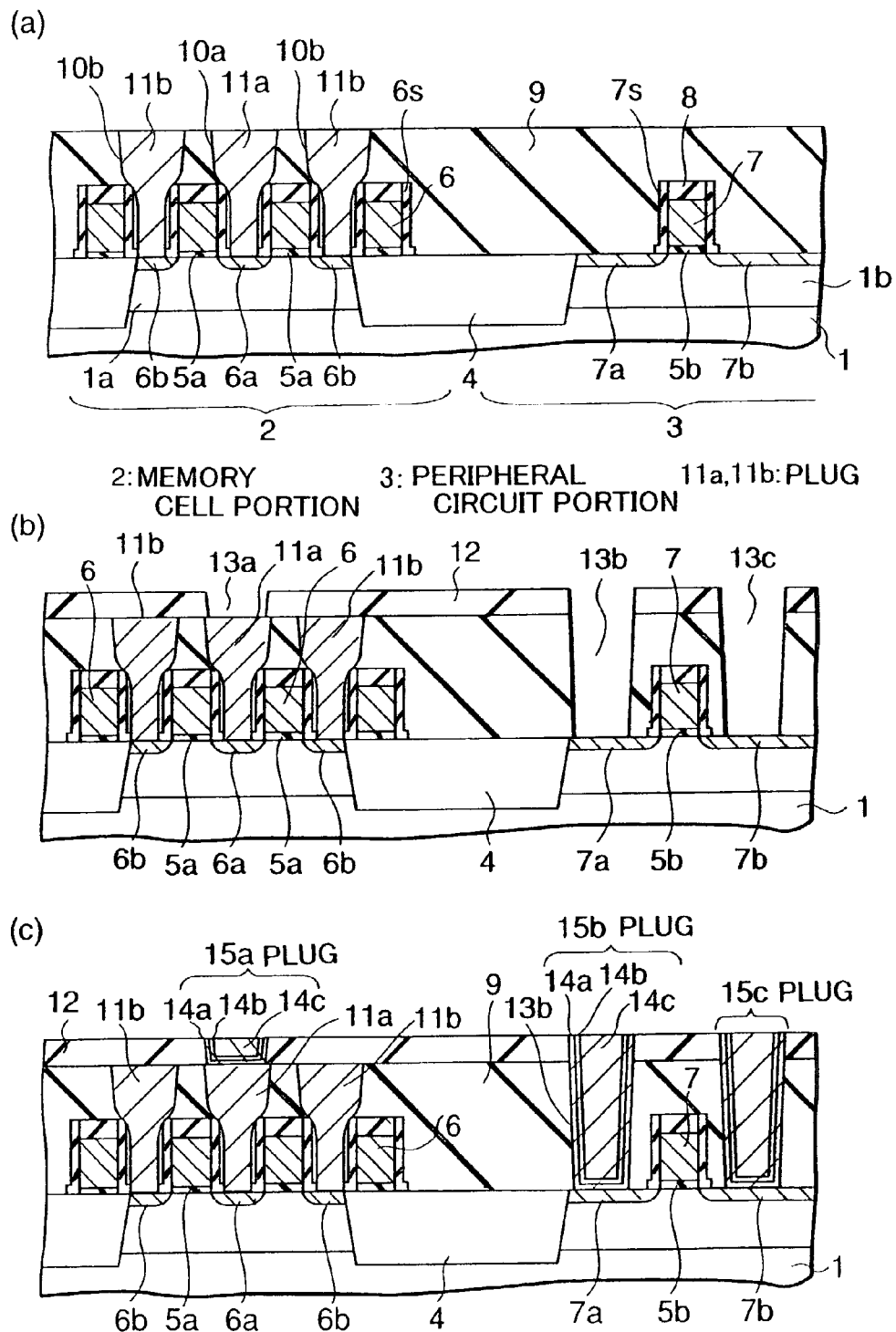
FIGS. 6(a) to (c) are sectional views (#1) showing manufacturing steps of a semiconductor device according to a first embodiment of the present invention.
Figure 7:
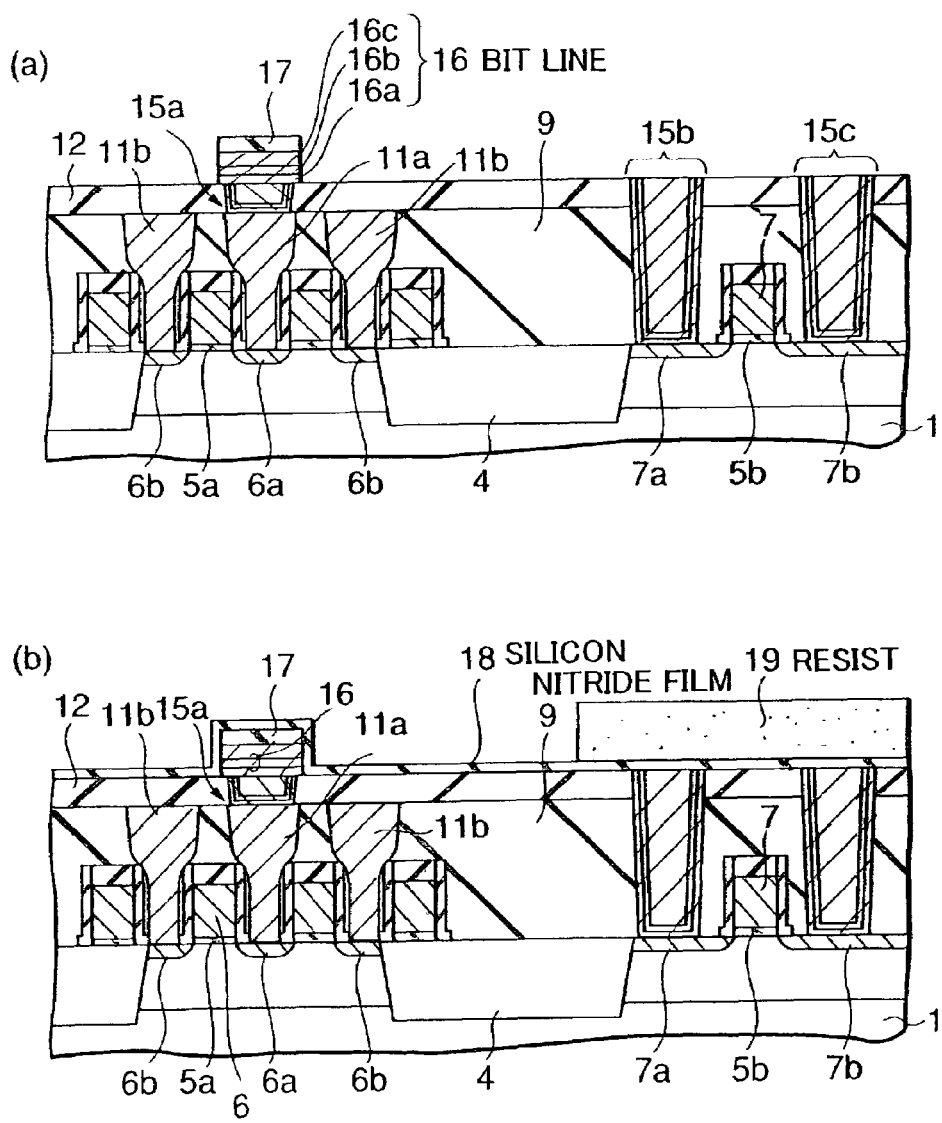
FIGS. 7(a), (b) are sectional views (#2) showing the manufacturing steps of the semiconductor device according to the first embodiment of the present invention.
Figure 8:
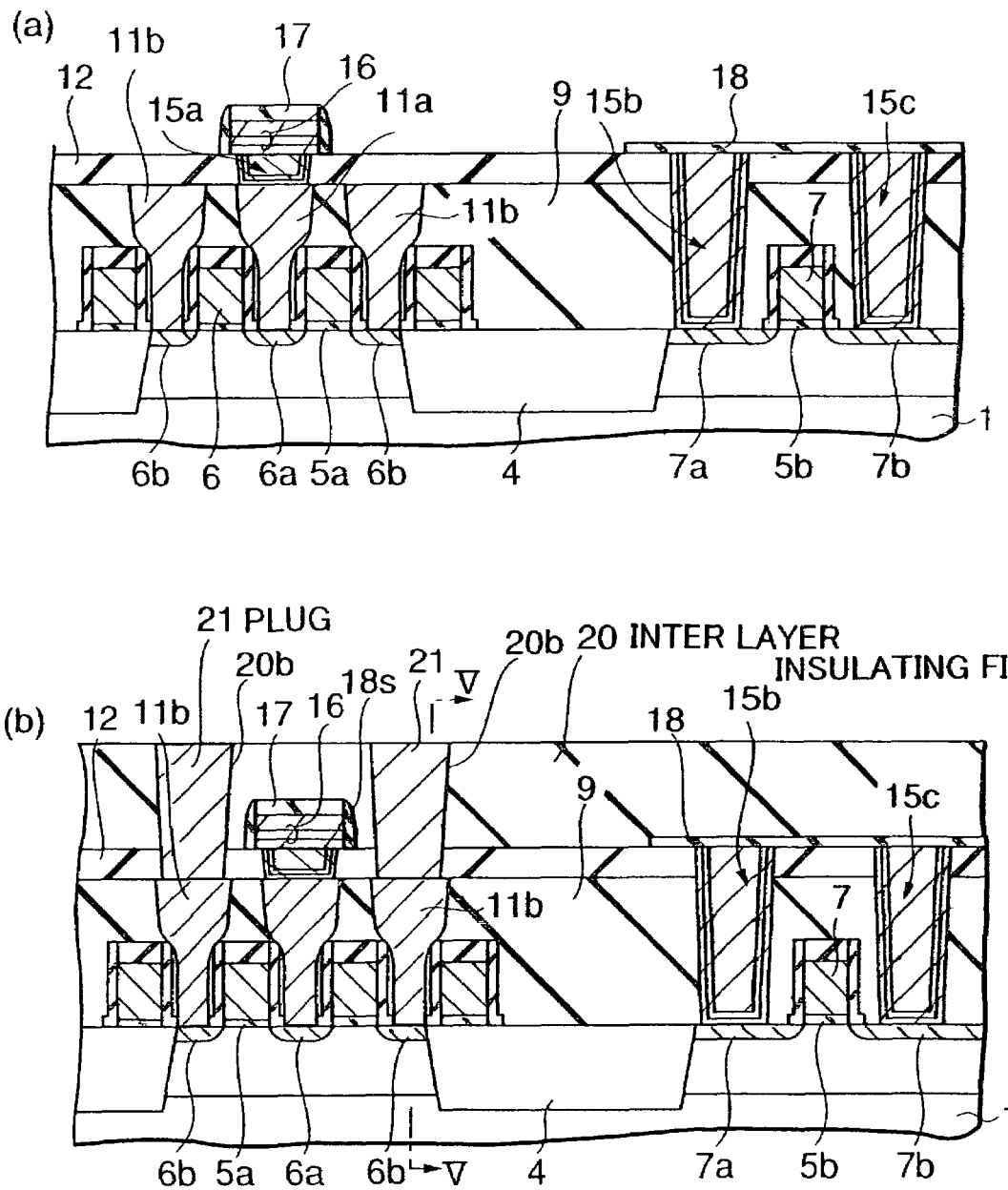
FIGS. 8(a), (b) are sectional views (#3) showing the manufacturing steps of the semiconductor device according to the first embodiment of the present invention.

Now, in FIG. 11, the upper contact holes 28b, 28c are formed at the positions that protrude from the lower contact plugs 15b, 15c by way of comparison with FIG. 5, but normally such upper contact holes 28b, 28c are to be formed at the target positions that coincide with the upper surfaces of the lower contact plugs 15b, 15c.

Then, the silicon nitride film 18 is etched via the upper contact holes 28b, 28c to expose the contact plugs 15b, 15c. In this case, the condition at which the second interlayer insulating film 12 is seldom etched is set, i.e., the CHF3 gas is used as the etching gas. Accordingly, lower end portions of the upper contact holes 28b, 28c are positioned in vicinity of the upper surfaces of the contact plugs 15b, 15c.

Then, the photoresist 29 is peeled off. Here, such peeling of the photoresist 29 may be executed after the etching of the third and fourth interlayer insulating films 20, 28.

If the upper contact holes 28b, 28c are formed to deviate from the lower contact plugs 15b, 15c, a part of the upper surfaces of the lower contact plugs 15b, 15c is covered with the silicon nitride film 18.

Figure 12:
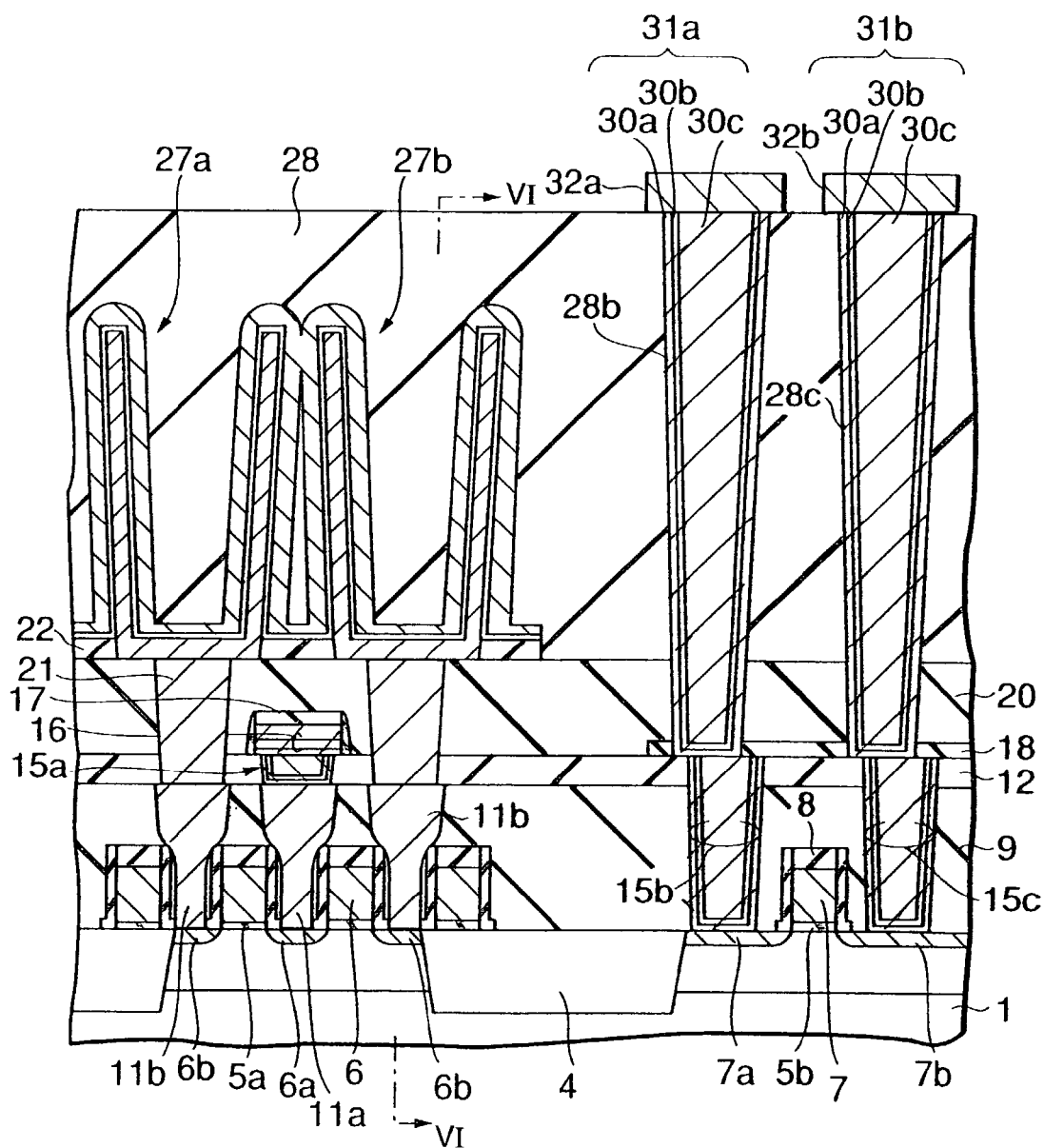
FIG. 12 is a sectional view (#7) showing the manufacturing steps of the semiconductor device according to the first embodiment of the present invention.

Next, steps required until a structure shown in FIG. 12 is formed will be explained hereunder.

First, a Ti film 30a of 20 nm thickness, a TiN film 30b of 20 nm thickness, and a W film 30c of 300 nm thickness are formed sequentially in the upper contact holes 28b, 28c and on the fourth interlayer insulating film 28 by the CVD method. Then, the Ti film 30a, the TiN film 30b, and the W film 30c on the fourth interlayer insulating film 28 are removed selectively by the CMP method. Then, the Ti film 30a, the TiN film 30b, and the W film 30c being left in the contact holes 28a, 28b are used as upper contact plugs 31a, 31b.

Then, in the peripheral circuit portion 3, wirings 32a, 32b are formed on the fourth interlayer insulating film 28, and then the wirings 32a, 32b are connected to the impurity diffusion layers 7a, 7b via the upper contact plugs 31a, 31b and the lower contact plugs 15b, 15c.

In this case, a sectional shape being viewed from a VI—VI line in the memory cell portion 2 in FIG. 12 is given as shown in FIG. 13(b).

According to the above embodiment, the sidewalls 18s made of the silicon nitride and formed on the side surfaces of the bit line 16 in the memory cell portion 2 and the etching stopper film 18 in the peripheral circuit portion 3 are formed at the same time. Therefore, even if the upper contact holes 28b, 28c, which are formed later in the third and fourth interlayer insulating films 20, 28 in the peripheral circuit portion 3, protrude from the lower contact plugs 15b, 15c, the upper contact holes 28b, 28c can be prevented from being dropped down largely from the upper surfaces of the lower contact plugs 15b, 15c.

Since normally the predetermined thermal process is needed to form the silicon nitride film, the characteristics of the MOSFETs are badly affected if the formation of the sidewalls and the etching stopper film is carried out separately two times. But the increase of the thermal process can be suppressed to the lowest minimum by forming them simultaneously.

Here, as shown in FIG. 13(a), the upper limit of the film thickness of the etching stopper film 18 is decided based on the request such that the mutual interval between the bit lines 16 should not be unnecessarily narrowed, whereas the lower limit of the film thickness is decided to satisfy the request as the stopper film that is used to form the upper contact holes 28a, 28b in the peripheral circuit portion 3. The thickness of the stopper film depends on the thickness of the overlying interlayer insulating film, but the thickness of at least 20 to 30 nm is required.

Figure 14:
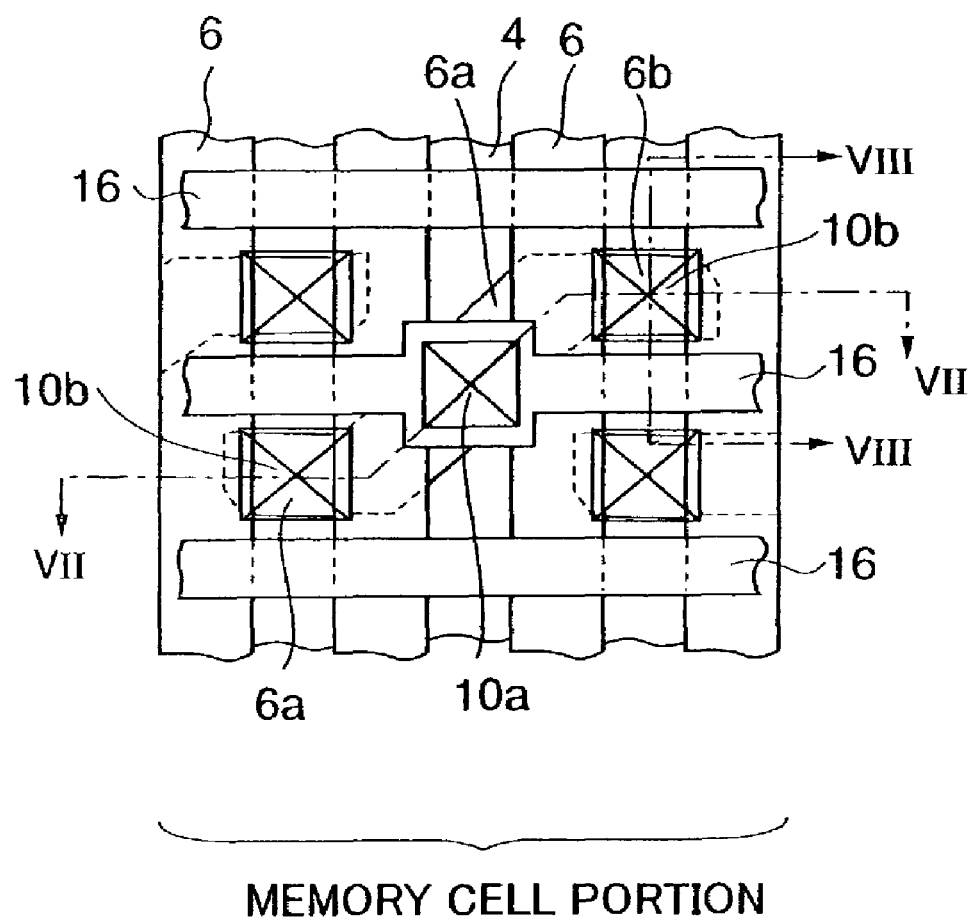
FIG. 14 is a plan view showing an arrangement among gate electrodes, contact portions, and bit lines in the memory cell portion of the semiconductor device according to the first embodiment of the present invention.

In this case, a positional relationship among the bit lines 16, the gate electrodes 6, and the contact portions in the memory cell portion 2, viewed as a plan view, is shown in FIG. 14. A sectional shape viewed from a VII—VII line in FIG. 14 is given in FIG. 7(a), and a sectional shape viewed from a VIII—VIII line in FIG. 14 is given in FIG. 13(a).

In place of the silicon nitride film 18 formed on the second interlayer insulating film 12 in the peripheral circuit portion 3, other material film, e.g., a silicon oxide nitride (SiON) film or an alumina ($Al_2O_3$) film, which can act as the etching stopper film in etching the third interlayer insulating film 20, may be formed.

By the way, as the countermeasure to overcome the problem shown in FIG. 5 in the prior art, the etching stopper film made of the conductive layer may be formed between the upper plugs 122b, 122c and the lower plugs 112b, 112c. For example, upon working the bit line 115, the conductive layer patterns of the size which is decided by estimating the displacement margin and the variation in diameter of the upper contact holes 121b, 121c are arranged between the upper plugs 122b, 122c and the lower plugs 112b, 112c. Thus, the event that the upper plugs 122b, 122c are dropped down from the lower plugs 112b, 112c can be avoided. However, since the conductive layer patterns in this case must be formed to have the size in which the displacement margin and the variation in diameter are estimated, such conductive layer patterns become larger in size than the lower contact holes 111b, 111c by about 0.2 μm, for example.

If a plurality of lower plugs 112b, 112c to which different potentials are applied are arranged adjacently, the limitation such that the conductive layer patterns formed on these lower plugs 112b, 112c must be arranged not to cause the short-circuit is imposed. Therefore, there is the drawback such that the mutual interval between the lower contact holes 111b, 111c in which the lower plugs 112b, 112c are buried is enlarged and in turn the chip size is increased.

Since the higher integration and the miniaturization are requested in the peripheral circuit portion of the hybrid DRAM, the margin for arranging such conductive layer patterns is not so left.

(Second Embodiment)

Figure 15:
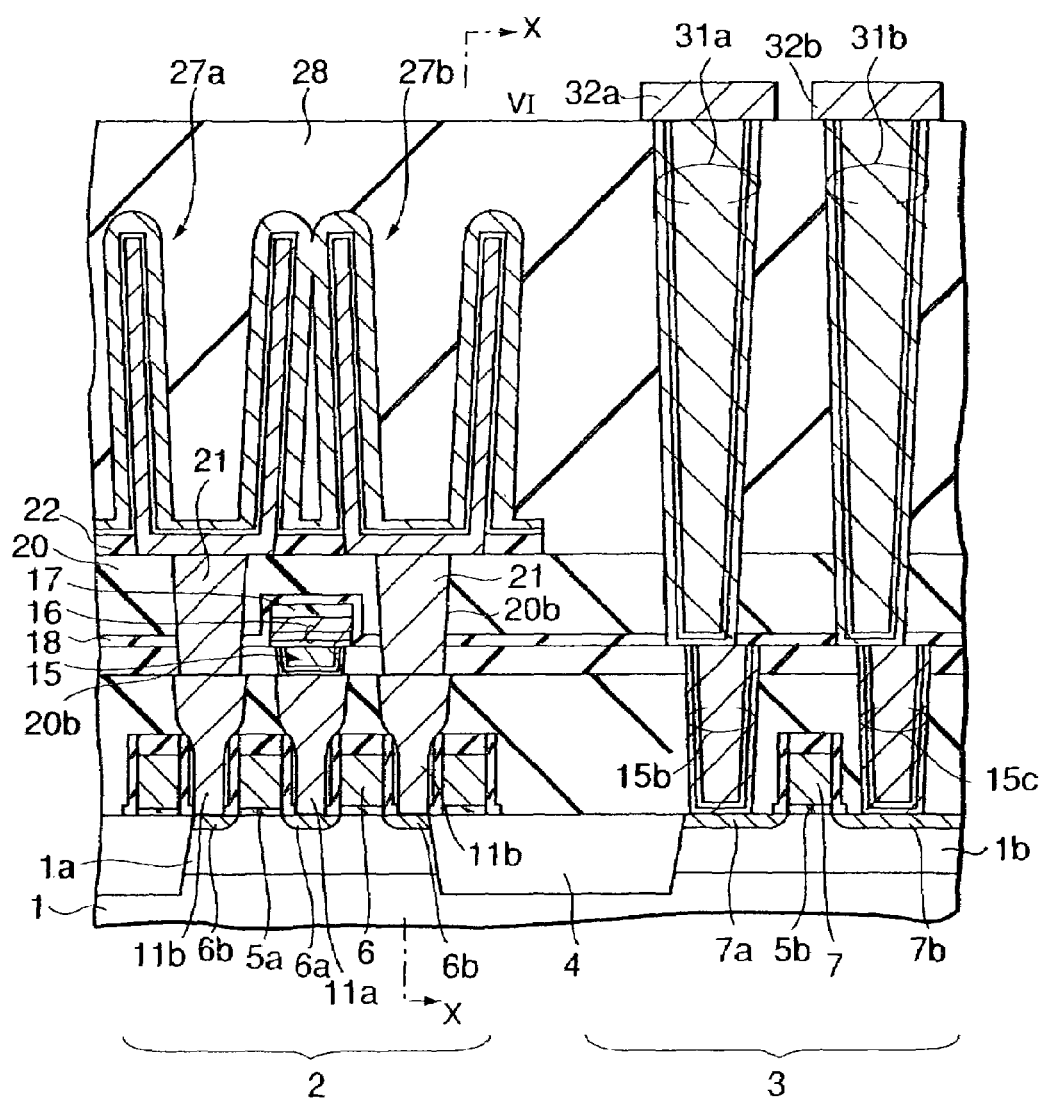
FIG. 15 is a sectional view showing a semiconductor device according to a second embodiment of the present invention.
Figure 16:
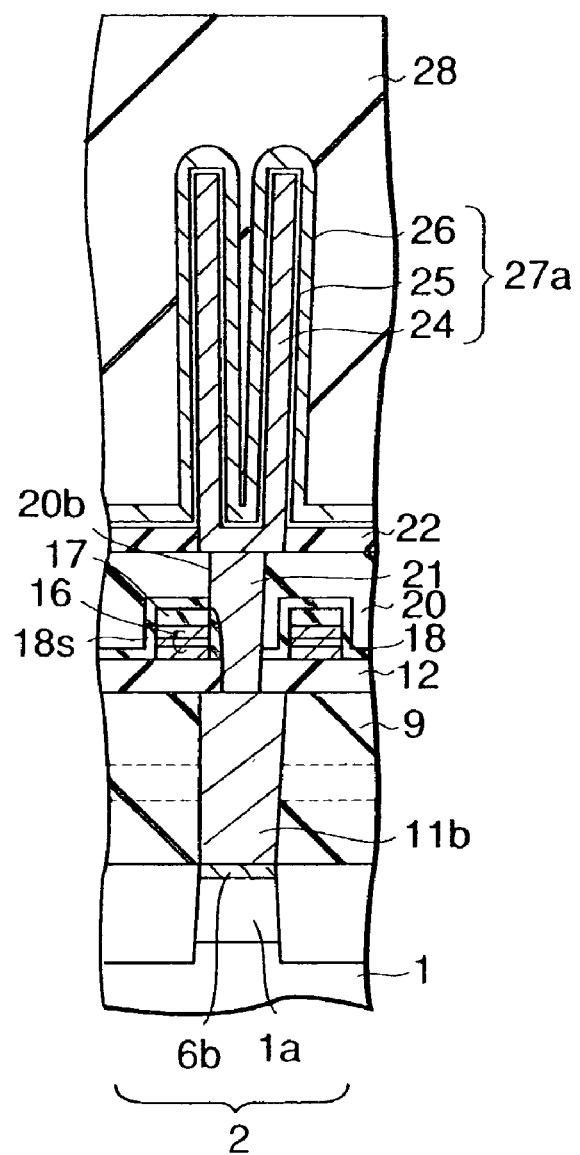
FIG. 16 is a X—X line sectional view of the semiconductor device shown in FIG. 15.

FIG. 15 is a sectional view showing a semiconductor device according to a second embodiment of the present invention. FIG. 16 is a X—X line sectional view of the semiconductor device shown in FIG. 15. In this case, in FIGS. 15 and 16, the same symbols as those in FIG. 12 denote the same elements.

In the present embodiment, the silicon nitride film 18 shown in FIG. 7(b) in the first embodiment is left over the entire surface not to execute the patterning, and is used as a short-circuit preventing film between the bit lines 16 and the upper contact plugs 21 for the storage contact in the memory cell portion 2 and also used as the etching stopper film in the peripheral circuit portion 3.

In this case, the etching for forming the upper contact hole 20b for the storage contact requires three steps that consist of the etching steps of the third interlayer insulating film 20 and the second interlayer insulating film 12 and the etching step of the silicon nitride film 18.

Meanwhile, as shown in FIG. 16, even if the displacement is caused between the bit lines 16 in forming the hole 20b for the storage contact, the silicon nitride film 18 still remains on both surfaces of the bit lines 16 after the etching and thus the bit lines 16 are never exposed.

In the case of the present embodiment, the formation of the photoresist 19 acting as the mask can be omitted by one step and the present embodiment is advantageous in cost rather than to the first embodiment.

(Third Embodiment)

In FIG. 10 of the first embodiment, the cell plate electrodes 26 are patterned and then the underlying silicon nitride film 22 is also patterned successively.

Figure 17:
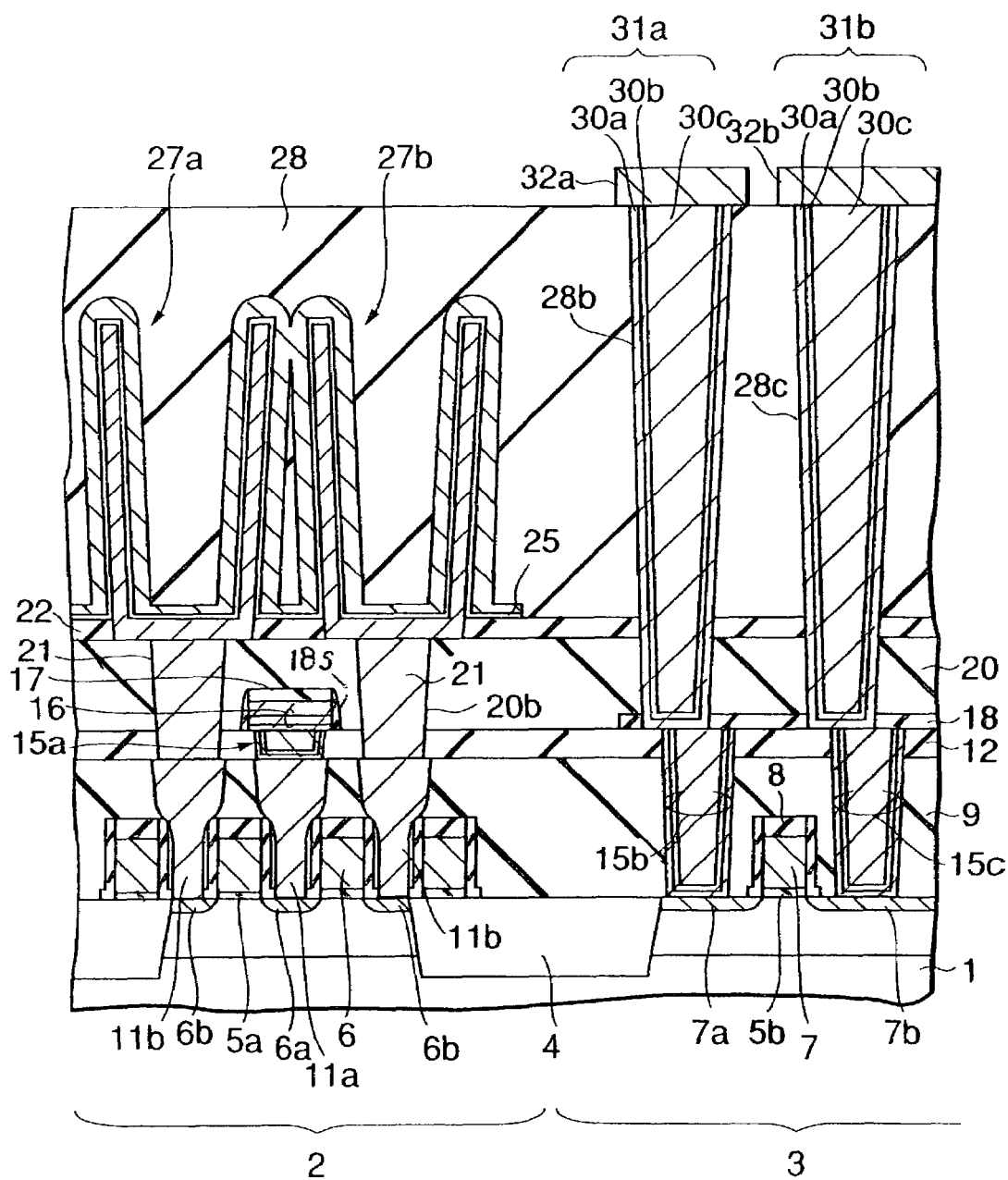
FIG. 17 is a sectional view showing a semiconductor device according to a third embodiment of the present invention.

However, as shown in FIG. 17, the silicon nitride film 22 may not be patterned and be left on the overall surface.

In this case, if the dielectric film 25 of the capacitor is formed of silicon nitride, such dielectric film 25 may be left.

In this manner, if the silicon nitride film 22 serving as the underling film of the capacitors 27a, 27b is not etched, steps of forming the upper contact holes 28b, 28c in the peripheral circuit portion 3 will be given as follows.

More particularly, the underlying silicon nitride film 22 is used temporarily as the etching stopper when the fourth interlayer insulating film 28 is to be etched, then the silicon nitride film 22 is etched, then the third interlayer insulating film 20 is etched, and then the silicon nitride film 18 is etched, whereby the upper contact holes 28b, 28c are formed.

According to such steps, the variation in thickness of the fourth interlayer insulating film 28 in the wafer surface and in the chip after the surface is polished can be canceled once by the silicon nitride film 22, and thus the production margin can be improved. In addition, since the silicon nitride film 22 is left when the cell plate electrodes 26 are patterned, the etching steps are never increased rather than the first embodiment.

In the present embodiment, the photoresist 19 shown in FIG. 7(b) is not formed in the peripheral circuit portion 3, and the silicon nitride film 18 may be removed from the peripheral circuit portion 3.

In FIG. 17, the same symbols as those in FIG. 12 denote the same elements.

(Fourth Embodiment)

Figure 18:
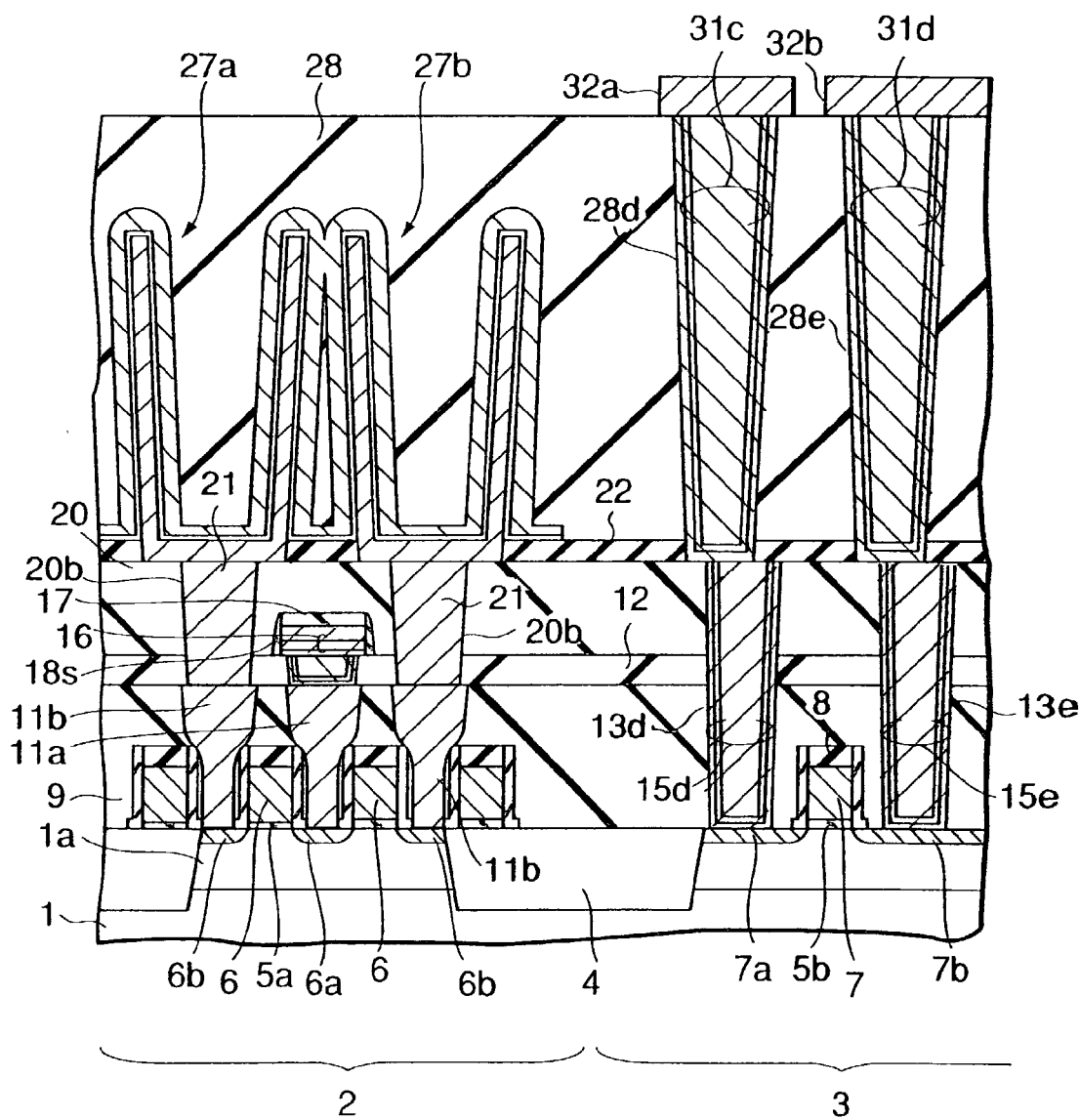
FIG. 18 is a sectional view showing a semiconductor device according to a fourth embodiment of the present invention.

FIG. 18 is a sectional view showing a semiconductor device according to a fourth embodiment of the present invention. In FIG. 18, the same symbols as those in FIG. 12 denote the same elements.

The present embodiment has such a structure that the lower contact plugs 15d, 15e connected to the impurity diffusion layers 7a, 7b in the peripheral circuit portion 3 are formed in the third interlayer insulating film 20 and underlying films, and also the upper contact plugs 31c, 31d are formed in the fourth interlayer insulating film 28 and the silicon nitride film 22.

In other words, the lower contact holes 13b, 13c are not formed in the peripheral circuit portion 3 at the same time when the upper contact hole 13a is formed in the second interlayer insulating film 12 in the memory cell portion, as shown in FIG. 6(b) in the first embodiment. The present embodiment has the structure that the contact holes 13d, 13e are formed by patterning the first, second, and third interlayer insulating films 9, 12, 20 in the peripheral circuit portion 3 before or after the upper contact plugs 21 for the storage contact are formed.

In this case, the contact plugs 15d, 15e formed in the contact holes 13d, 13e are constructed to have a triple-layered structure of the Ti film, the TiN film, and the W film, like the first embodiment. That is, the Ti film, the TiN film, and the W film are formed in the contact holes 13d, 13e and on the third interlayer insulating film 20, and then the metal films on the third interlayer insulating film 20 is removed by the CMP method, whereby the metal films left in the lower contact holes 13d, 13e are used as the contact plugs 15d, 15e.

In the present embodiment, in the peripheral circuit portion 3, the silicon nitride film 18 may be removed from the peripheral circuit portion 3 without the formation of the photoresist 19 shown in FIG. 7(b).

Instead of this, the silicon nitride film 22 formed under the capacitors 27a, 27b is not removed and is left. According to this, when the upper contact holes 28d, 28e are formed by patterning the fourth interlayer insulating film 28 in the peripheral circuit portion 3, the underlying silicon nitride film 22 acts as the etching stopper film, so that the variation in the fourth interlayer insulating film 28 having a large thickness can be canceled.

As described above, if the lower contact holes 13d, 13e are formed in the first, second, and third interlayer insulating films 9, 12, 20 and then the upper contact holes 28d, 28e are formed in the third interlayer insulating film 28, such upper contact holes 28d, 28e become shallower than those in the first embodiment and thus their working becomes easy.

(Fifth Embodiment)

In the fourth embodiment, the lower contact holes 13d, 13e being formed in the peripheral circuit portion 3 are formed before or after the upper contact holes 20b for the storage contact in the memory cell portion 2 are formed. But these holes may be formed simultaneously.

Figure 19:
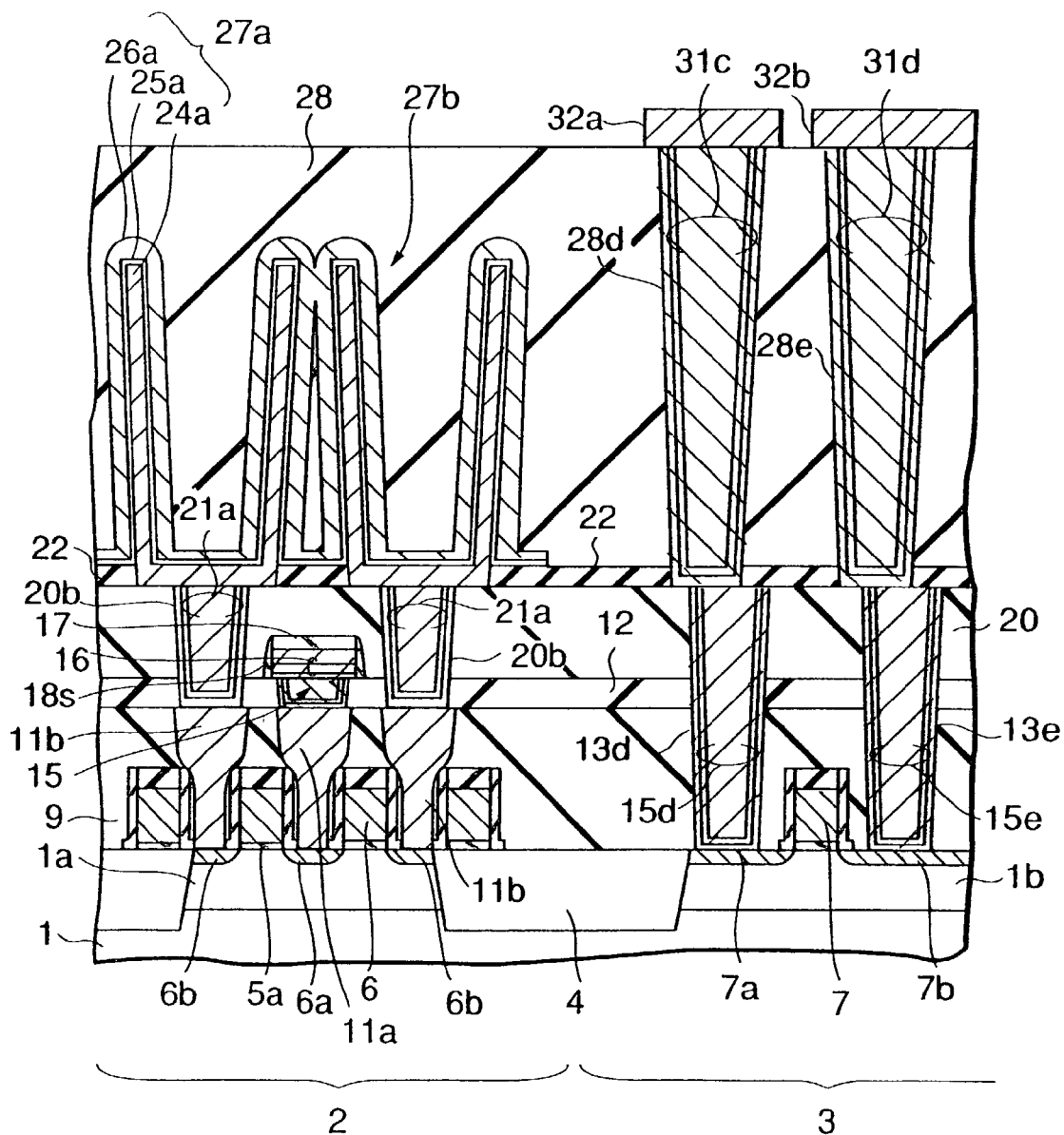
FIG. 19 is a sectional view showing another semiconductor device according to a fifth embodiment of the present invention.

In this case, as shown in FIG. 19, the Ti film, the TiN film, and the W film being formed sequentially in the lower contact holes 13d, 13e are also formed in the holes 20b for the storage contact.

Accordingly, if the lower contact holes 13d, 13e and the holes 20b for the storage contact are formed simultaneously, not the doped silicon but the metal film having the triple-layered structure is formed in the holes 20b for the storage contact and then such metal film is used as the upper contact plugs 21a.

In this case, there is no need that the storage electrodes 24a connected to the upper contact plugs 21a should be formed of silicon. Such storage electrodes 24a can be formed of the metal such as platinum, ruthenium, ruthenium oxide, strontium ruthenate, etc. If the ruthenium oxide is used as the storage electrodes 24a, the oxide dielectric film such as strontium barium titanate (BST), strontium titanate (STO), tantalum oxide, PZT, or the like, for example, is used as the capacitor dielectric film 25a. Also, the same material as the storage electrodes 24a may be employed as the plate electrodes 26a.

In FIG. 19, the same symbols as those in FIG. 18 denote the same elements.

(Sixth Embodiment)

Figure 20:
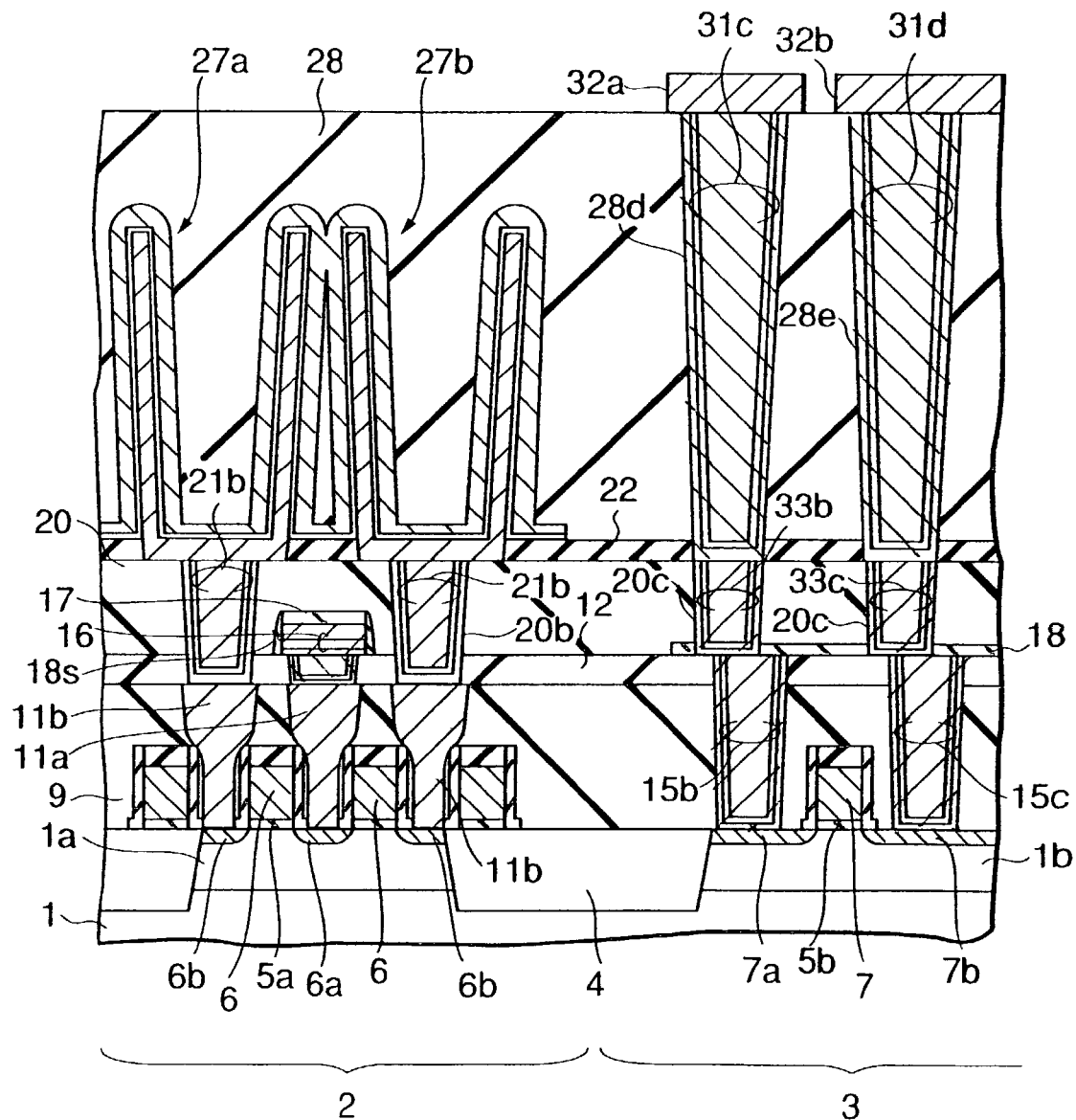
FIG. 20 is a sectional view showing a semiconductor device according to a sixth embodiment of the present invention.

As shown in FIG. 20, in the semiconductor device according to a sixth embodiment, the contact plugs connected to the impurity diffusion layers 7a, 7b in the peripheral circuit portion 3 are constructed as a three-stage structure.

In the present embodiment, intermediate contact holes 20c are formed on the lower contact plugs 15b, 15c by patterning the second interlayer insulating film 20 in the peripheral circuit portion 3 at the same time when, in FIG. 8(b) in the first embodiment, the upper contact holes 20b for the storage contact are formed by patterning the second and third interlayer insulating films 12, 20 in the memory cell portion 2.

In this case, the conditions that the etching of the second interlayer insulating film 20 is stopped by the underlying silicon nitride film 18 are selected, whereby the intermediate contact holes 20c are not dropped down largely from the lower contact plugs 15b, 15c. Then, the intermediate contact holes 20c are connected to the lower contact plugs 15b, 15c by etching selectively the silicon nitride film 18 via the intermediate contact holes 20c.

Then, the metal film having a triple-layer structure consisting of titanium, titanium nitride, and tungsten is formed in the upper contact holes 20b for the storage contact in the memory cell portion 2 and the intermediate contact holes 20c in the peripheral circuit portion 3 respectively. Accordingly, the upper contact plugs 21b made of the metal film are formed in the upper contact holes 20b, and intermediate contact plugs 33b, 33c made of the metal film are formed in the intermediate contact holes 20c.

In this case, the metal film formed on the third interlayer insulating film 20 is removed by the CMP method.

In this fashion, in case the upper contact plugs 21b in the upper contact holes 20c for the storage contact in the memory cell portion 2 are formed of the metal, the capacitors 27a, 27b may be formed to have the structure similar to that shown in the fifth embodiment.

The upper contact plugs 31c, 31d formed by the similar steps to those in the fifth embodiment are connected onto the intermediate contact plugs 33b, 33c formed in the peripheral circuit portion 3.

It is like the fourth embodiment that the upper contact holes 28d, 28e into which the upper contact plugs 31c, 31d are buried are formed by using the silicon nitride film 22, which is formed under the fourth interlayer insulating film 28, as the etching stopper.

As described above, if the number of stages of the contact plugs that are formed in the interlayer insulating film in the peripheral circuit portion 3 is increased, respective holes into which the contact plugs are buried become shallow and thus the working can be facilitated. In this case, the silicon nitride films 18, 22 act as the etching stopper during the etching to form the intermediate and upper contact holes 20c, 28d, 28e.

Also, since depths of respective contact holes 20c, 28d, 28e are shallow, any one or both of the silicon nitride films 18, 22 may be removed from the peripheral circuit portion 3.

In FIG. 20, the same symbols as those in FIG. 19 denote the same elements.

(Seventh Embodiment)

In the first embodiment, as shown in FIG. 6(b) and FIG. 7(a), the upper contact hole 13a is formed in the second interlayer insulating film 12, then the upper contact plug 15a is formed in the upper contact hole 13a, and then the metal film constituting the bit line 16 is formed on the second interlayer insulating film 12.

Figure 21:
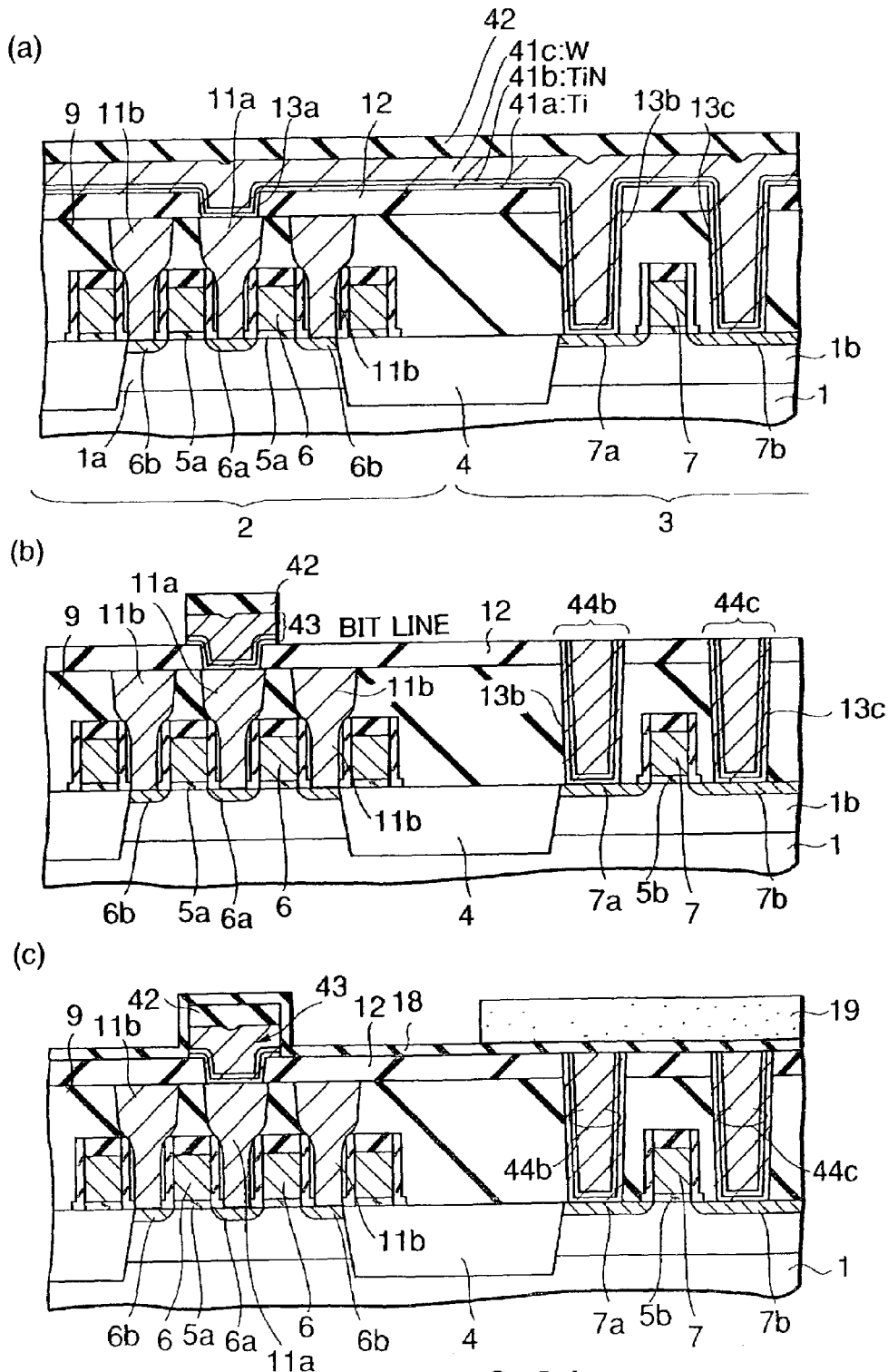
FIGS. 21(a) to (c) are sectional views showing a manufacturing method of a semiconductor device according to a seventh embodiment of the present invention.

However, it is possible to form the bit line 16 and the underlying contact plug 15a at a time. Such steps will be explained with reference to FIGS. 21(a) to (c) hereunder. In FIGS. 21(a) to (c), the same symbols as those in FIG. 6(b) denote the same elements.

First, starting from the state shown in FIG. 6(b), a titanium film 41a of 50 nm thickness, a titanium nitride film 41b of 50 nm thickness, and a tungsten film 41c of 150 nm thickness are formed sequentially by the CVD method in the upper contact hole 13a for the bit line contact in the memory cell portion 2 and the contact holes 13b, 13c in the peripheral circuit portion 3 and on the second interlayer insulating film 12. Then, a protection insulating film 42 made of titanium nitride and having a thickness of 100 nm is formed on the tungsten film 41c by the CVD method.

Then, as shown in FIG. 21(b), the titanium film 41a, the titanium nitride film 41b, and the tungsten film 41c are patterned by the normal photolithography method, whereby a bit line 43 is formed in the memory cell portion 2 and also lower contact plugs 44b, 44c are formed in the peripheral circuit portion 3. In this case, the bit line 43 is connected directly to the lower contact plug 11a.

Meanwhile, it is preferable that a thickness of the tungsten film 41c should be set to a thickness enough to prevent the protection insulating film 42 from entering into the lower contact plugs 44b, 44c in the peripheral circuit portion 3. Also, it is preferable that such thickness of the tungsten film 41c should be set thin to the extend that the bit line 43 can be easily processed.

In the case of the present embodiment, the method of removing the metal film on the second interlayer insulating film 12 by the CMP method to leave in the contact holes 13b, 13c is not applied, but such removal is carried out simultaneously with the etching to work the bit line 43. Therefore, the number of steps can be largely reduced. Also, since the metal film constituting the contact plugs 44b, 44c and the metal film constituting the bit line 43 are formed by the same film forming step, the film formation of titanium, titanium nitride, and tungsten can be omitted by one time respectively. Now, like the protection insulating film 17 in the first embodiment, the protection insulating film 42 made of the silicon nitride is used to prevent the short-circuit between the upper contact plug 21 for the storage contact and the bit line 43.

Then, as shown in FIG. 21(c), the silicon nitride film 18 of 50 nm thickness is formed on the bit line 43, the plugs 44b, 44c and the second interlayer insulating film 12 by the low pressure CVD method, and then the photoresist 19 for covering the peripheral circuit portion 3 is formed. Subsequent steps are similar to the first embodiment.

What is claimed is:

1. A semiconductor device comprising:
   a first impurity diffusion layer formed in a semiconductor substrate in a first region;
   a second impurity diffusion layer formed in the semiconductor substrate in a second region;
   a first insulating film formed over the semiconductor substrate;
   a first hole in the first insulating film over the first impurity diffusion layer in the first region;
   a first conductive plug formed in the first hole;
   a wiring formed on the first insulating film in the first region;
   a second insulating film formed over the wiring and the first insulating film in the first region and the second region;
   a second hole formed in the second insulating film away from the wiring in the first region and connected to the first hole;
   an electrode formed on the second insulating film in the first region and connected electrically to the first conductive plug through the second hole;
   a third hole formed in the first insulating film over the second impurity diffusion layer in the second region;
   a fourth hole formed in the second insulating film on the third hole in the second region;
   a second conductive plug formed in the third hole;
   a third conductive plug formed in the fourth hole; and
   a third insulating film formed of material different from the second insulating film, formed on side surfaces of the wiring, and formed from on a portion of an upper surface of the second conductive plug to on a portion of the first insulating film around the second conductive plug:
   wherein, the fourth hole is formed to pass through a portion of the third insulating film on the upper surface of the second conductive plug, and is formed on the upper surface of the second conductive plug and on an upper surface of the first insulating film.

2. A semiconductor device according to claim 1, wherein the third insulating film comes in touch with a part of upper surface of the second conductive plug or is present at a position higher than the upper surface.

3. A semiconductor device according to claim 1, wherein the third insulating film is extended to the first region and the second region between the first insulating film and the second insulating film.

4. A semiconductor device according to claim 1, further comprising:
   a third impurity diffusion layer formed in the semiconductor substrate in the first region;
   a fifth hole formed in the first insulating film over the third impurity diffusion layer; and
   a fourth conductive plug formed in the fifth hole and connected electrically to the wiring.

5. A semiconductor device according to claim 1, further comprising:
   a fourth insulating film formed over the second insulating film and the electrode; and
   a sixth hole formed in the fourth insulating film in the second region and connected to the fourth hole.

6. A semiconductor device according to claim 5, wherein the fourth hole is formed as an extended part of the sixth hole, and the third conductive plug is formed in the fourth hole and the sixth hole.

7. A semiconductor device according to claim 1, further comprising:
   a fifth insulating film formed between the electrode and the second insulating film in the first region and formed on the second insulating film in the second region;
   a fourth insulating film formed of material different from the fifth insulating film and formed on the fifth insulating film; and
   a seventh hole formed in the fourth insulating film and the fifth insulating film and connected to the fourth hole.

8. A semiconductor device according to claim 7, wherein the fourth hole is formed as an extended part of the seventh hole, and the third conductive plug is also formed in the seventh hole.

9. A semiconductor device according to claim 1, wherein the first region is a region in which memory cells are formed, and the second region is a region in which peripheral circuits are formed.

10. A semiconductor device comprising:
    a first impurity diffusion layer and a second impurity diffusion layer formed in a semiconductor substrate in a first region;
    a third impurity diffusion layer formed in the semiconductor substrate in a second region;
    a first insulating film for covering the first impurity diffusion layer, the second impurity diffusion layer, and the third impurity diffusion layer;
    a first hole in the first insulating film in the first region;
    a first conductive plug formed in the first hole;
    a second insulating film formed over the first conductive plug and the first insulating film;
    a second hole formed in the second insulating film in the first region to expose the first conductive plug;
    a third hole formed in the first insulating film and the second insulating film in the second region and having a depth to reach the third impurity diffusion layer;
    a second conductive plug formed in the third hole;
    a wiring formed on the second insulating film and connected electrically to the first conductive plug through the second hole;
    a third insulating film formed on side surfaces of the wiring, and formed from on a portion of upper surface of the second conductive plug to on a portion of the second insulating film around the second conductive plug;
    a fourth insulating film formed over the third insulating film and made of material different from the third insulating film; and
    a fourth hole formed in the third insulating film and the fourth insulating film in the second region such that at least a part of the fourth hole overlaps with the second conductive plug;
    a third conductive plug formed in the forth hole;
    wherein, the fourth hole is formed to pass through a portion of the third insulating film on the upper surface of the second conductive plug, and is formed on the upper surface of the second conductive plug and on an upper surface of the first insulating film.

* * * * *